(12) United States Patent
Spanier et al.

(10) Patent No.: US 9,059,264 B2
(45) Date of Patent: Jun. 16, 2015

(54) TUNABLE HOT-ELECTRON TRANSFER WITHIN A NANOSTRUCTURE

(71) Applicants: Jonathan E Spanier, Bala Cynwyd, PA (US); Guannan Chen, Philadelphia, PA (US); Eric M Gallo, Philadelphia, PA (US); Baris Taskin, Philadelphia, PA (US)

(72) Inventors: Jonathan E Spanier, Bala Cynwyd, PA (US); Guannan Chen, Philadelphia, PA (US); Eric M Gallo, Philadelphia, PA (US); Baris Taskin, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 13/626,934

(22) Filed: Sep. 26, 2012

(65) Prior Publication Data

US 2013/0075702 A1 Mar. 28, 2013

Related U.S. Application Data

(60) Provisional application No. 61/539,075, filed on Sep. 26, 2011.

(51) Int. Cl.
| | |
|---|---|
| *H01L 29/775* | (2006.01) |
| *H01L 31/0256* | (2006.01) |
| *H01L 29/06* | (2006.01) |
| *H01L 29/41* | (2006.01) |
| *H01L 31/0352* | (2006.01) |
| *B82Y 10/00* | (2011.01) |

(52) U.S. Cl.
CPC .......... *H01L 29/775* (2013.01); *H01L 31/0256* (2013.01); *H01L 29/0673* (2013.01); *H01L 29/068* (2013.01); *H01L 29/413* (2013.01); *H01L 31/035227* (2013.01); *B82Y 10/00* (2013.01)

(58) Field of Classification Search
CPC ..... H01L 51/0048; H01L 33/24; H01L 33/06; H01L 29/78696; H01L 29/66742; H01L 29/775; H01L 31/0256; H01L 31/035227; H01L 29/068; H01L 29/413; H01L 29/0673
USPC .......... 257/9, 29, 30, 184, 327, 368; 438/2, 48
See application file for complete search history.

(56) References Cited

U.S. PATENT DOCUMENTS

| | | | |
|---|---|---|---|
| 5,903,170 A | 5/1999 | Kulkarni et al. | |
| 6,853,035 B1 | 2/2005 | King | |
| 6,882,051 B2 * | 4/2005 | Majumdar et al. | 257/746 |
| 7,301,199 B2 * | 11/2007 | Lieber et al. | 257/327 |
| 2002/0175408 A1 * | 11/2002 | Majumdar et al. | 257/734 |
| 2003/0089899 A1 * | 5/2003 | Lieber et al. | 257/9 |

OTHER PUBLICATIONS

Kittel, introduction to Solid state Physics (john Wiley) 1986 p. 185.*

(Continued)

*Primary Examiner* — Thinh T Nguyen
(74) *Attorney, Agent, or Firm* — Baker & Hostetler LLP

(57) ABSTRACT

Provided are multimaterial devices, such as coaxial nanowires, that effect hot photoexcited electron transfer across the interface of the materials. Modulation of the transfer rates, manifested as a large tunability of the voltage onset of negative differential resistance and of voltage-current phase, may be effected by modulating electrostatic gating, incident photon energy, and the incident photon intensity. Dynamic manipulation of this transfer rate permits the introduction and control of an adjustable phase delay within a device element.

14 Claims, 22 Drawing Sheets

(56) References Cited

OTHER PUBLICATIONS

Adachi, S., "GaAs, AlAs, and $Al_xGa_{1-x}As$@B: Material Parameters for Use in Research and Device Applications," J. Appl. Phys., Aug. 1985, 58(3), R1-R29.

Belenky et al., "Collector-Up Light-Emitting Charge Injection Transistors in n-InGaAs/InAlAs/p-InGaAs and n-InGaAs/InP/p-InGaAs heterostructures," J. Appl. Phys., Jun. 1993, 73(12), 8618-8627.

Cao et al., "Engineering Light Absorption in Semiconductor Nanowire Devices," Nature Mater., Aug. 2009, 8(8), 643-647.

Cao et al., "Enhanced Raman Scattering from Individual Semiconductor Nanocones and Nanowires," Phys. Rev. Lett., Apr. 2006, 96, 157402-1-157402-4.

Chen et al., "On Direct-Writing Methods for Electrically Contacting GaAs and Ge nanowire devices," Appl. Phys. Lett., May 2010, 96(22), 223107-1-223107-3.

Chen et al., "Supplementary Material Online: Tunable Hot-Electron Transfer Within a Single Core-Shell Nanowire," Phys. Rev. Lett., 2011, 1-5.

Chen et al., "Tunable Hot-Electron Transfer Within a Single Core-Shell Nanowire," Phys. Rev. Lett., Oct. 2011, 107(15), 156802-1-156802-5.

Claudon et al., "A highly Efficient Single-Photon Source Based on a Quantum Dot in a Photonic Nanowire," Nat. Photon., Mar. 2010, 4(3), 174-177.

Demichel et al., "Impact of Surfaces on the Optical Properties of GaAs Nanowires," Appl. Phys. Lett., Nov. 2010, 97(20), 201907-1-201907-3.

Duan et al., "Single-Nanowire Electrically Driven Lasers," Nature, Jan. 2003, 421(6920), 241-245.

Gabor et al., "Extremely Efficient Multiple Electron-Hole Pair Generation in Carbon Nanotube Photodiodes," Science, Sep. 2009, 325(5946), 1367-1371.

Gallo et al., "Picosecond Response Times in GaAs/AlGaAs core/shell Nanowire-Based Photodetectors," Appl. Phys. Lett., Jun. 2011, 98(24), 241113-1-241113-3.

Glisson et al., "Monte Carlo Simulation of Real-Space Electron Transfer in GaAs—AlGaAs Heterostructures," J. Appl. Phys., Oct. 1980, 51(10), 5445-5449.

Goodnick et al., "Effect of Electron-Electron Scattering on Nonequilibrium Transport in Quantum-Well Systems," Phys. Rev. B, Feb. 1988, 37(5), 2578-2588.

Hess et al., "Negative Differential Resistance Through Real-Space Electron Transfer," Appl. Phys. Lett., Sep. 1979, 35(6), 469-471.

Jacoboni et al., "The Monte Carlo Method for the Solution of Charge Transport in Semiconductors With Applications to Covalent Materials," Rev. Mod. Phys., Jul.-Sep. 1983, 55(3), 645-705.

Keever et al., "Measurements of Hot-Electron Conduction and Real-Space Transfer in GaAs—$Al_xGa_{1-x}As$ Heterojunction Layers," Appl. Phys. Lett., Jan. 1981, 38(1), 36-38.

Khanal et al., "Gate Coupling and Charge Distribution in Nanowire Field Effect Transistors," Nano Lett., Sep. 2007, 7(9), 2778-2783.

Luryi, S., "Light-emitting Devices Based on the Real-Space Transfer of Hot Electrons," Appl. Phys. Lett., Apr. 1991, 58(16), 1727-1729.

Oulton et al., "Plasmon Lasers At Deep Subwavelength Scale," Nature, Oct. 2009, 461(7264), 629-632.

Prete et al., "Luminescence of GaAs/AlGaAs Core-Shell Nanowires Grown by MOVPE Using Tertiarybutylarsine," J. Cryst. Growth, Nov. 2008, 310(23), 5114-5118.

Qian et al., "Multi-Quantum-Well Nanowire Heterostructures for Wavelength-Controlled Lasers," Nature Mater., Sep. 2008, 7(9), 701-706.

Ross et al., "Efficiency of Hot-Carrier Solar Energy Converters," J. Appl. Phys., May 1982, 53(5), 3813-3818.

Ruda et al., "Polarization-Sensitive Optical Phenomena in Semiconducting and Metallic Nanowires," Phys Rev B, Sep. 2005, 72(11), 115308-1-115308-11.

Sambur et al., "Multiple Exciton Collection in a Sensitized Photovoltaic System," Science, Oct. 2010, 330(6000), 63-66.

Shockley et al., "Detailed Balance Limit of Efficiency of p-n Junction Solar Cells," J. Appl. Phys., Mar. 1961, 32(3), 510-519.

Tisdale et al., "Hot-Electron Transfer from Semiconductor Nanocrystals," Science, Jun. 2010, 328(5985), 1543-1547.

Van Kouwen et al., "Single Electron Charging in Optically Active Nanowire Quantum Dots," Nano Lett., May 2010, 10(5), 1817-1822.

Wagner et al., "Observation of the Intraexciton Autler-Townes Effect in GaAs/AlGaAs Semiconductor Quantum Wells," Phys. Rev. Lett., Oct. 2010, 105, 167401-1-167401-4.

Wang et al., "Calculation of the electron velocity distribution in high electron mobility transistors using an ensemble Monte Carlo method," J. Appl. Phys., Jun. 1985, 57(12), 5336-5339.

Wang et al., "Highly Polarized Photoluminescence and Photodetection From Single Indium Phosphide Nanowires," Science, Aug. 2001, 293(5534), 1455-1457.

Whitaker et al., "Picosecond Switching Time Measurement of a Resonant Tunneling Diode," Appl. Phys. Lett., Aug. 1988, 53(5), 385-387.

Xiang et al., "Ge/Si Nanowire Heterostructures As High-Performance Field-Effect Transistors," Nature, May 2006, 441(7092), 489-493.

Yan et al., "Nanowire Photonics," Nat. Photon., Oct. 2009, 3(10), 569-576.

Yan et al., "Programmable Nanowire Circuits for Nanoprocessors," Nature, Feb. 2011, 470(7333), 240-244.

Z. Gribnikov, "Negative Differential Conductivity in a Multilayer Heterostructure", Soviet Physics: Semiconductors, Jan. 1973, 6(7), 1204.

* cited by examiner

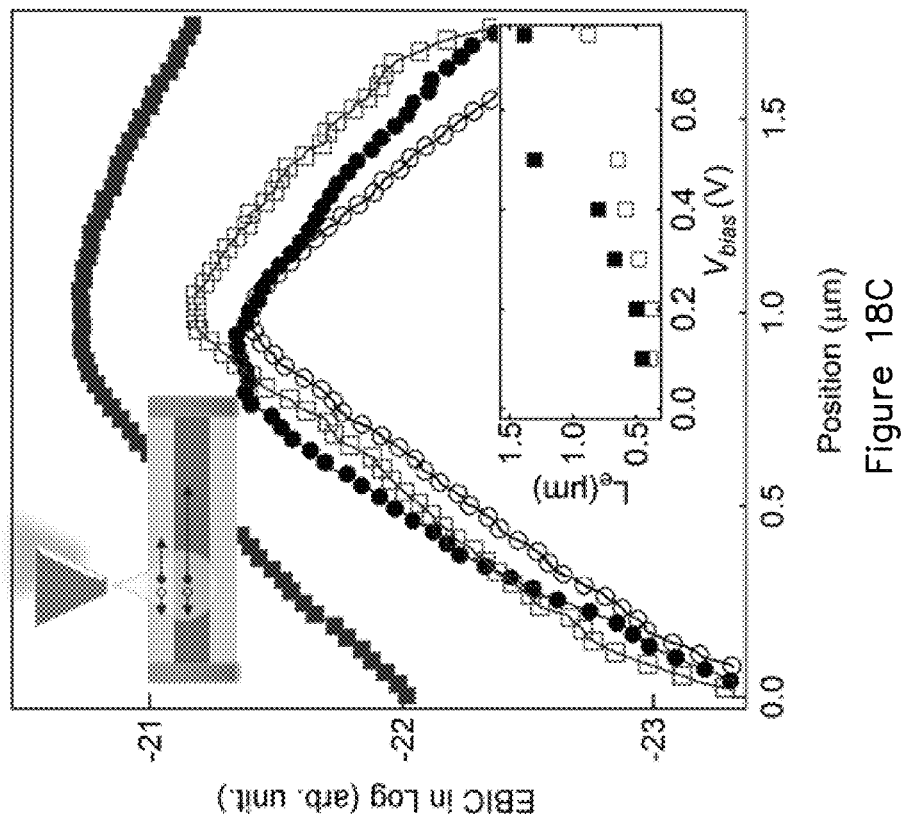
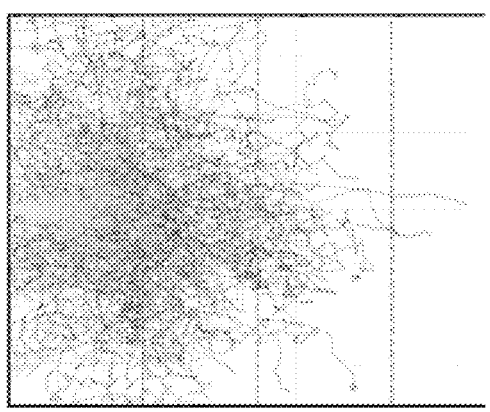
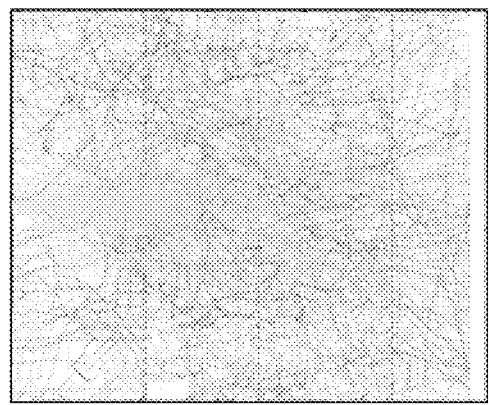

TUNABLE HOT-ELECTRON TRANSFER WITHIN A NANOSTRUCTURE

RELATED APPLICATION

This application claims the benefit of U.S. application 61/539,075, "Tunable Hot-Electron Transfer Within a Nanostructure," filed Sep. 26, 2011, the entirety of which is incorporated herein in its entirety for any and all purposes.

STATEMENT OF GOVERNMENT RIGHTS

This work was supported by National Science Foundation grant DMR-0907381 and Army Research Office grant W911NF-08-1-0067. The government has certain rights in this invention.

TECHNICAL FIELD

The present disclosure relates to the fields of nanotechnology, solid-state devices, and to electron transfer.

BACKGROUND

Understanding the effects of finite size and dimensionality on the interaction of light with semiconductor nanostructures, e.g., local enhancement of electromagnetic fields, optical absorption, exciton dynamics, multiexciton generation, and electron transfer across semiconductor heterostructures is central to identifying and exploiting novel modes of efficient conversion and transfer of energy.

However, insight into the physics of hot-electron cooling and transfer across electrically interfaced heterojunctions in real-space transfer ("RST") devices has been limited. Accordingly, there is a long-felt need in the art for devices and methods having useful electron transfer and other electronics characteristics. The value of such devices and methods would be further improved if the devices and methods possessed tunable characteristics.

SUMMARY

Disclosed are hot electron-based non-linear elements based on real-space transfer of photo-excited electrons across the co-axial interface of a core-shell nanowire (NW), permitting, for the first time, robust tuning of the onset of negative differential resistance (NDR) by multiple modes in a nanoscale device that operates room temperature. These devices are based on realization of tunable real-space transfer of hot electrons in high bandwidth semiconductor core-shell NWs, with significant potential for disruption in CMOS technology, and in high-sensitivity thermal discrimination/imaging.

The highly versatile room-temperature devices exhibiting tunable NDR and phase are distinguished, in some embodiments, by strong field-effect coupling and alternately, by optoelectronic intensity and/or wavelength modulation. Control of phase and frequency multiplication are achieved through tuning the voltage onset of negative differential resistance using either electrostatic gating or varying incident photon flux, enabled by geometric confinement of electrons in this quasi one-dimensional system.

The functions enabled by these devices include signal processing delivered at the nanoscale in an on-CMOS chip level. This has the potential to be highly disruptive for many technologies, e.g. communications and advanced sensing. Selected important nonlinear electronic devices are typically realized using components that are larger than, and not able to be integrated within, complementary metal oxide semiconductor (CMOS) architectures, the semiconductor device industry standard. This separation of signal processing functions from core logic and memory introduces latency that can limit performance. The integration of nonlinear device elements such as those based on negative differential resistance with CMOS enables simpler and more scalable nano-fabrication of complex integrated circuits. The second sector relates to infrared detection, wavelength discrimination and imaging.

Real space transfer in the core-shell NW provides a platform of exploring the fundamental physics of hot electron cooling and interfacial electron transfer with external light interaction at heterostructure materials. In addition, the size and geometry confinement offers a significant enhancement of transfer rate compared to the planar counterpart structure.

NDR is useful to a wide range of conventional semiconductor devices that play critical roles in ICs. Key to the operation of programmable phase delay elements, resonators and frequency multiplexing, phase-locked loops and related technologies are capacitive elements that are constrained by minimum size for charge readout, or by tunnel-based devices possessing characteristics that are fixed by composition and doping, and therefore do not typically possess the required tunability. The introduction of a single nanoscale element possessing electrically- and optically-tunable impedance presents assembling integrated circuits using fewer and far smaller elements.

NDR devices find wide application to logic circuits, static memory cells and oscillators. The current CMOS market accounts for a large portion of the global $306.8 B semiconductor market. Core-shell nanowire present a particularly useful geometry—a cylindrical gate-all-around structure to maximize the field coupling The present disclosure provides, for example, tunable hot-electron transfer of photoexcited electrons across the coaxial interface of an exemplary coreshell nanowire. It should be understood that the coaxial nanowire configuration is illustrative only and does not limit the scope of the present disclosure to any particular geometry or configuration.

The rate of RST in the coaxial nanowire geometry may be tuned using inter alia, three different mechanisms and is manifest as a tunability of the negative differential resistance. Without being bound to any particular theory, the dependence of the transfer rate on an energy relaxation length scale may possess a stronger power law dependence in the coaxial geometry than in a planar geometry. Tunability using an incident light wavelength indicates a fast carrier dynamic, which is useful to the study of hot carrier cooling. The controlled variation of incident photon flux on electron-electron interactions presents a means of investigating momentum relaxation and distribution in geometrically confined nanostructures. The introduction of a single nanoscale element possessing electrically and optically tunable complex impedance presents application to integrated circuits, including oscillators, amplifiers, phase shifters, frequency multipliers, phase-locked loops, and laser switches, using fewer and far smaller elements, and with the versatility of a highly local optical interface.

In one aspect, the present disclosure provides semiconductor structures supported by a substrate, the semiconductor structure comprising a first material and a second material contacting one another, the first and second materials being arranged in a non-planar configuration, the second material having a valence bandgap, conduction bandgap, or both that are broader than the corresponding band of the first material, the structure being in electronic communication with a source electrode and a drain electrode and a source of illumination in optical communication with the structure, a source of electrostatic potential in electronic communication with the structure, or both.

The present disclosure also provides methods of operating a device. These methods include exposing, to light, to an electrostatic field, or to both, a semiconductor structure comprising a first material and a second material contacting one another, the first and second materials being arranged in a non-planar configuration, the second material having a valence bandgap, conduction bandgap, or both that are broader than the corresponding band of the first material, the structure being in electronic communication with a source electrode and a drain electrode, the exposing being modulated so as to alter an electronic characteristic of the semiconductor structure, such as negative differential resistance ("NDR").

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 18 presents beam energy effect. (a) and (b) Monte-Carlo simulations (CASINO v2.4) of beam trajectory path in Al0.24Ga0.76As/GaAs/Al0.24Ga0.76As on Si/SiO2 substrate with equivalent thickness. (c) the comparison of the EBIC line profiles between 5 kV (solid squares) and 10 kV (open circles) for low biases 0.3 V (black) and 0.5 V (red).

DETAILED DESCRIPTION OF ILLUSTRATIVE EMBODIMENTS

Figure 1:
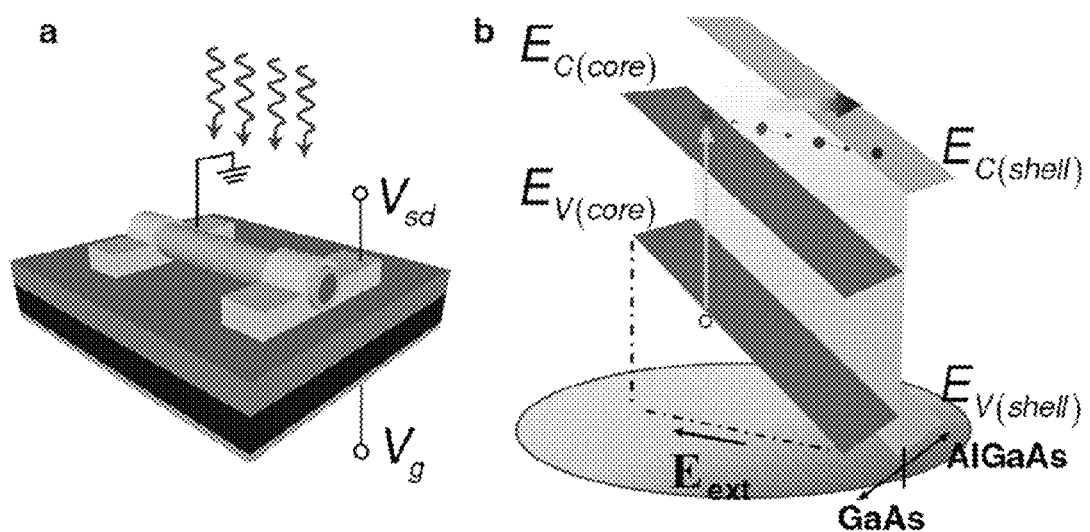
FIG. 1 presents schematic illustrations of (a) nanowire (NW) device configuration under illumination and under source-drain bias $V_{sd}$, and (b) electronic band diagram depicting the real-space transfer of photoexcited electrons from the NW core to the shell conduction bands under large bias field $E_{ext}$.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range. Any and all documents cited in this application are incorporated herein by reference in their entireties.

In a first aspect, the present disclosure provide electronic devices. These devices suitably include a semiconductor structure supported by a substrate, the semiconductor structure comprising a first material and a second material contacting one another, the first and second materials being arranged in a non-planar configuration, the second material having a valence bandgap, conduction bandgap, or both that are broader than the corresponding band of the first material, the structure being in electronic communication with a source electrode and a drain electrode and a source of illumination in optical communication with the structure, a source of electrostatic potential in electronic communication with the structure, or both.

The first material of the semiconductor structure is suitably in electronic communication with a source electrode and with a drain electrode. The electrodes may be constructed of virtually any suitable material (e.g., metals). Copper is considered a particularly suitable electrode material, although other conductive metals and alloys may be used.

The first and second materials may be arranged in variety of configurations. In some embodiments, the materials are arranged in a core-shell configuration, with the first material being characterized as the core, and the second material being characterized as the shell.

The core-shell configuration may define a coaxial structure, such as a nanowire. The coaxial structure may be straight or curved. The structure may be cylindrical in character, but may also be triangular in cross-section, faceted, or both. A variety of configurations may be used; configurations where electron transfer from one material can effectively take place along the length of the interface of the materials are considered especially suitable. Structures where wires of the first and second materials are braided or twisted together with one another are suitable, as are structures where a wire, strip, band, or sheet of one material is wrapped around the other material.

The first material suitably has a thickness in the range of from about 1 nm to about 500 nm, or from about 5 nm to 250 nm, or from 10 nm to 100 nm. The thickness dimension may refer to a cross-sectional dimension, such as a through-thickness, a diameter, a width, and the like. For example, the first material may be characterized as the core of a coaxial nanowire structure, and have a diameter in the range of from about 1 nm to about 500 nm.

The second material suitably has a thickness in the range of from about 1 nm to about 500 nm, or from about 5 nm to 250 nm, or from 10 nm to 100 nm. The thickness dimension may refer to a cross-sectional dimension, such as a through-thickness, a diameter, a width, and the like. For example, the second material may be characterized as the shell of a coaxial nanowire structure, and have a thickness in the range of from about 1 to about 500 nm.

In some embodiments, the second material suitably has a valence bandgap, a conduction bandgap, or both that are broader or greater relative to the corresponding band of the first material.

In some embodiments, the hetero-junction between the materials is of either Type I or Type II. In the latter case, the offset of the conduction band for electrons and/or the valence band for holes is suitably (but no necessarily) more than kT (0.026 eV at 300K, room temperature), and suitably less than 3 eV, or even less than about 1 eV.

The illumination source of the disclosed devices may be capable of providing illumination of a single wavelength or illumination of multiple wavelengths. Similarly, the illumination source may be capable of providing illumination of a single intensity or of multiple intensities. The illumination source may also be capable of varying both the wavelength and intensity of the illumination.

Suitable wavelengths include any wavelength range commensurate with variation in the conduction and/or valence band offset between first material and second material, i.e., from 1 nm to about 3000 nm. The range of suitable intensities may be in the range of from about 10-300 meV, and may be centered at wavelengths that could range from 350-1500 nm). The optimal intensity and wavelength will depend on the particular device in use.

The illumination can be from, but is not limited to, monochromatic source in the form of a gas emission line, solid state source, or monochromatized white light source. The illumination may be delivered in a spatially broad manner or with locality on the device.

It should be understood that the devices may include multiple seminconductor structures with one or more sources of illumination. In this way, multiplexed devices may be constructed where multiple semiconductor structures are illuminated. A single illuminator may be used to illuminate multiple structures, or multiple illuminators may be used to illuminate multiple structures.

The devices may include a source of electric potential, e.g., a source of electrostatic field. Suitable sources of such potential include gate electrodes, which electrodes may be placed or otherwise located on a substrate that supports the semiconductor structure. Alternatively, the gate electrode may be of a wrapped configuration (e.g. placed conformally or otherwise on top of the nanowire). The electrodes may even be of transparent or semitransparent electrode material, as may be required by the choice of illumination wavelength. The gate electrode may suitably be in electronic communication with the semiconductor structure.

A variety of materials are suitable for use as the first material in the disclosed structures. The first material may include, for example, gallium, arsenic, GaAs, or other elemental, binary, ternary inorganic or organic semiconductor materials.

The second material may likewise be an elemental, binary, ternary or other inorganic or organic semiconductor material. AlGaAs is one suitable material. Multiple (i.e., two or more) materials may be used in the devices, which materials may be used to effect band-gap engineering and carrier transport for other considerations in the device . For example, in the case of a material having a GaAs core and AlGaAs shell, an additional GaAs outer shell layer may be used to stabilize the AlGaAs against oxidation. Other materials may be used to provide a protective layer (such as an anti-oxidation layer) for the devices. As described elsewhere herein, the first and second materials may be selected on the basis that the second material has a broader (or wider) bandgap than does the first material.

Substrate materials may include essentially any material for suitable for mechanically supporting the device. Silicon is a suitable material. Materials that reduce capacitive coupling to the device (such as sapphire, for example) are considered especially suitable substrate materials, although the elimination of capacitance in the substrate is not a requirement.

Also disclosed are methods of operating electronic devices. The methods include exposing, to light, to an electrostatic field, or to both, a semiconductor structure comprising a first material and a second material contacting one another, the first and second materials being arranged in a non-planar configuration, the second material having a valence bandgap, conduction bandgap, or both that are broader than the corresponding band of the first material, the structure being in electronic communication with a source electrode and a drain electrode, the exposing being modulated so as to alter an electronic characteristic of the structure. As one example, the NDR of the structure may be altered; NDR may be altered by up to 50% of the value of voltage onset of NDR corresponding and corresponding to up to 180 degrees of phase in complex impedance.

The illumination suitably includes at least one wavelength in the range of from about 1 nm to about 3000 nm. Near-IR, visible, and ultraviolet light are all considered suitable.

The illumination may have an intensity in the range of from about 0.1 microwatt to about 500 mW/cm$^2$, or from about 1 microwatt to about 100 mW/cm$^2$.

Where an electrostatic field is employed, the field may be effected by a gate voltage. The gate voltage is suitably in the range of $-10V<Vg<+10Vg$. The user may vary the wavelength, intensity, or both of the light. The user may also vary the intensity or even the frequency of the electrostatic field. A user may also modulate the temperature in the environment exterior to the semiconductor.

Variation of operational variables (e.g., intensity of radiation, frequency of radiation, intensity of electrostatic field)

Exemplary Embodiments

Core-shell nanowires (CSNWs) each composed of a GaAs core and an $Al_{0.33}Ga_{0.67}As$ shell were introduction of dopant. Dopant may, however, be grown via metallorganic vapor phase epitaxy without additional included in the disclosed devices.

CSNWs were dispersed onto a 200-nm thick thermally grown $SiO_2$ film on an electrically contacted Si(100) substrate for electrostatic gating, and electron beam lithography was used to define electrical contacts directly to the core near each end of the CSNWs. The NW cores possess a nearly intrinsic character at 300 K: they are slightly p-type on the basis of the recent demonstration of gate modulation of conductance within GaAs NWs without a shell, consistent with the unintentional doping (C) from precursor molecules, and thereby substantially suppressing the scattering by ionized dopants in the GaAs NW cores. The alloy composition x was estimated to be 0.33 in the $Al_xGa_{1-x}As$ shells based on the results of the Voigt line shape fitting-based determination of the positions of the GaAs TO and LO phonon modes, and AlAs- and GaAs-like TO and LO modes for the $Al_xGa_{1-x}As$ alloy in the Raman spectra collected from the core-shell NWs, thus permitting the extraction of values for x(Al). Values obtained for x were consistent (within a few percent) with those obtained from photoluminescence spectroscopy. Without being bound to any single theory, the shells were expected to be weakly n-type due to unintentional doping (Si) from the Al-based precursor.

The CSNWs exhibit significant photocurrent sensitivity (~0:1 μA/W) at 300 K in their low-bias voltage response to either monochromatic laser or broadband illumination as evidenced by remarkably small dark currents (<50 fA), amounting to more than 3 orders of magnitude in the linear variation in the photocurrent. A nearly linear photocurrent-voltage relationship for small DC bias $V_{bias}$ at 300 K indicates that photo-generated carriers encounter a negligibly small barrier when collected. However, the application of a larger bias reveals negative differential resistance (NDR) in the photocurrent, where a threshold voltage $V_{th}$ is defined by the onset of the NDR. For $V_{bias} \approx V_{th}$ photoexcited electrons in the GaAs NW core can acquire sufficient energy from the large component of E parallel to the NW axis, exceeding the GaAs-$Al_{0.33}Ga_{0.67}As$ conduction band offset ($\Delta E_c \approx 0.255$ eV), and undergo RST into the shell [FIG. 1(b)]. For $V>V_{th}$, the curve bends down, and with a further increase in the applied electric field E, the slope of the curve becomes nearly zero and the photocurrent is saturated.

For certain E values, the RST of photoexcited electrons from the higher electron mobility NW core to the lower-mobility and wider-gap shell, and the accompanying observation of NDR in photocurrent density $J_{h\omega}$, can be described by $dJ_{h\omega}/dE = q\delta n[\mu - f\Delta\mu - (df/dE)\Delta\mu E]$, where $\Delta\mu = \mu_1 - \mu_2$, $\mu_1$ and $\mu_2$ denote GaAs core and $Al_{0.33}Ga_{0.67}As$ shell electron mobilities (bulk values are ~8000 cm$^2$ V$^{-1}$ s$^{-1}$ and ≤500 cm$^2$ V$^{-1}$ s$^{-1}$), respectively, $\delta n$ is the concentration of photo-induced electrons within the GaAs core, and $f$ is an E field-dependent fraction of carriers photoexcited within the core that reach the shell. A peak in the current is expected when $dJ_{h\omega}/dE=0$, i.e., $\mu_1/\Delta\mu=f+Edf/dE$, from which estimates of $f$ at $V_{th}$ can be obtained by numerically solving the above ($0:23 \le f \le 0:45$).

Because of the complexity of solving the Boltzmann transport equation involving RST, Monte Carlo simulations are usually applied to simulate the velocity v-E relationship. Assuming E is constant along the axis of the NW, one may estimate that the measured $V_{th}$ corresponds to $E \approx 10$ kV/cm. This is comparable to the value of ~3 kV/cm in bulk structures calculated by Monte Carlo simulations and obtained experimentally; an increase is consistent with predictions of increases in the threshold voltage for decreased dimensionality from bulk to two dimensions.

Figure 2:
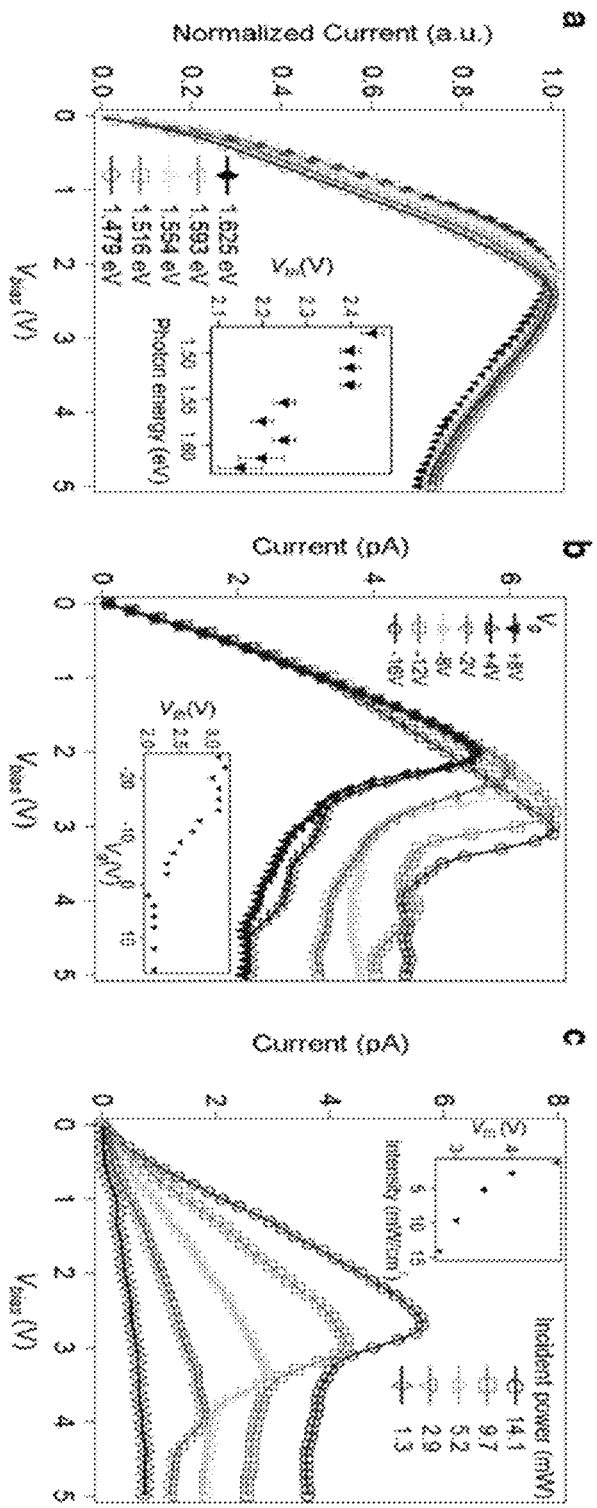
FIG. 2 presents photocurrent-voltage traces, collected at 300 K, for different values of (a) laser excitation wavelength demonstrating tunability (trace is normalized by the peak current at $V_{th}$ (Inset: decrease of $V_{th}$ for increasing laser excitation energy); (b) substrate gate bias $V_g$, as denoted in the legend (Inset: the increase in $V_{th}$ for larger negative gate voltages, demonstrating the electrostatic gate tuning of $V_{th}$); and (c) incident optical intensity, as denoted in the legend (Inset: dependence of $V_{th}$ with incident optical intensity).

In terms of relating the observed NDR in photocurrent to RST, RST is directly related to the energy that a hot electron accrues from incident photon energy. Incident radiation with a larger energy difference ($E_{h\omega}$-$E_{g,GaAs}$) will generate a broader distribution of electron energies in excess of $E_{g,GaAs}$ (and higher electron temperatures), requiring a lower electric field to undergo RST. In fact, this dependence was verified by observing a shift in $V_{th}$ with incident photon energy, i.e., $dV_{th}/dE_{h\omega}<0$ [FIG. 2(a)]. In addition to its potential application for a wavelength-selective nonlinear device element, significantly, this finding also (without being bound to any single theory) indicates that the transit time for electrons to reach the RST threshold is comparable to, or shorter than, the hot-electron cooling time, indicating the potential for this device in high-frequency RST-based nanoscale optoelectronics.

As $V_{th}$ depends on $\Delta E_c$, the rate of RST and the field associated with its onset in a CSNW can be manipulated via the electrostatic gating of the entire length of the CSNW, given its radial proximity to the gate electrode. The measured photocurrent vs $V_{bias}$ with substrate gating demonstrates that $V_{th}$ can be tuned by up to~50%, with $dV_{th}=dV_g<0$, confirming that it is electrons (and not holes) in the GaAs core that are undergoing RST [FIG. 2(b)]. The additional field contributed by $V_g>0$ provides a radial component of momentum to the electrons in the GaAs core (transverse to the heterojunction) to enter the AlGaAs shell. Nonuniformity in the radial field distribution from gate coupling is expected, as maximum field is reached where the NW is in physical contact with the gate oxide.

The asymmetric NDR response of the devices to gating can be understood by considering the additional contribution to the overall capacitance owing to the NW shell-core interface in the form of a bipolar (n-p) junction-isolated channel. Electron transfer across the NW heterojunction under $V_g>0$ is analogous to a negatively biased p-n junction, in which saturation can be attained with small $V_g$. For $V_g<0$, however, the bipolar channel is under positive bias and saturation is not observed for an appreciable range of $V_g$. On the basis of the strong electrostatic gating effect, of estimates of energy differences between the conduction band offset and transition energies associated with different conduction band minima in k space, and of the observed excitation energy dependence of RST, one may observe that it is much more energetically favorable for electrons to undergo RST than intervalley transition(s).

Under a high E field, electron-electron scattering contributes to randomizing energy gained from the E field along the channel, resulting in an increased momentum relaxation rate and a shorter time scale for the carrier distribution to reach a steady state. This is particularly beneficial for RST since the randomization process enables a larger fraction of transporting electrons in the channel to accrue a sufficient radial component of momentum to transfer across the interface.

Based on the principle that the electron-electron scattering rate is a function of carrier concentration (in the case $\delta$n), one may investigate the effect of this scattering rate on the onset of RST by varying the optical excitation intensity $I_{h\omega}$. One observes that $V_{th}$ can also be tuned by ~50%, with $dV_{th}=dI_{h\omega}<0$ over the range $0 \le I_{h\omega} \le 14:1$ mW/cm² [FIG. 2(c)]. Below a threshold excitation intensity, however, the NDR feature is diminished, likely due to insufficient electron-electron scattering.

Without being bound to any theory, the observed NDR may not necessarily be due to an unintended and unconfirmed presence of a tunnel barrier in the devices: the experimental results and a priori knowledge that the GaAs NW cores are p-type, taken together with an estimate of the peak instantaneous net excess carrier concentration under the experimental conditions ($\delta n=7:0\times10^{17}$ cm$^{-3}$[32]), and the absence of an appreciable thermal contribution, indicate that a tunneling process cannot explain the observed NDR feature in the photocurrent and its tenability with electrostatic gating and incident photon flux.

Figure 3:
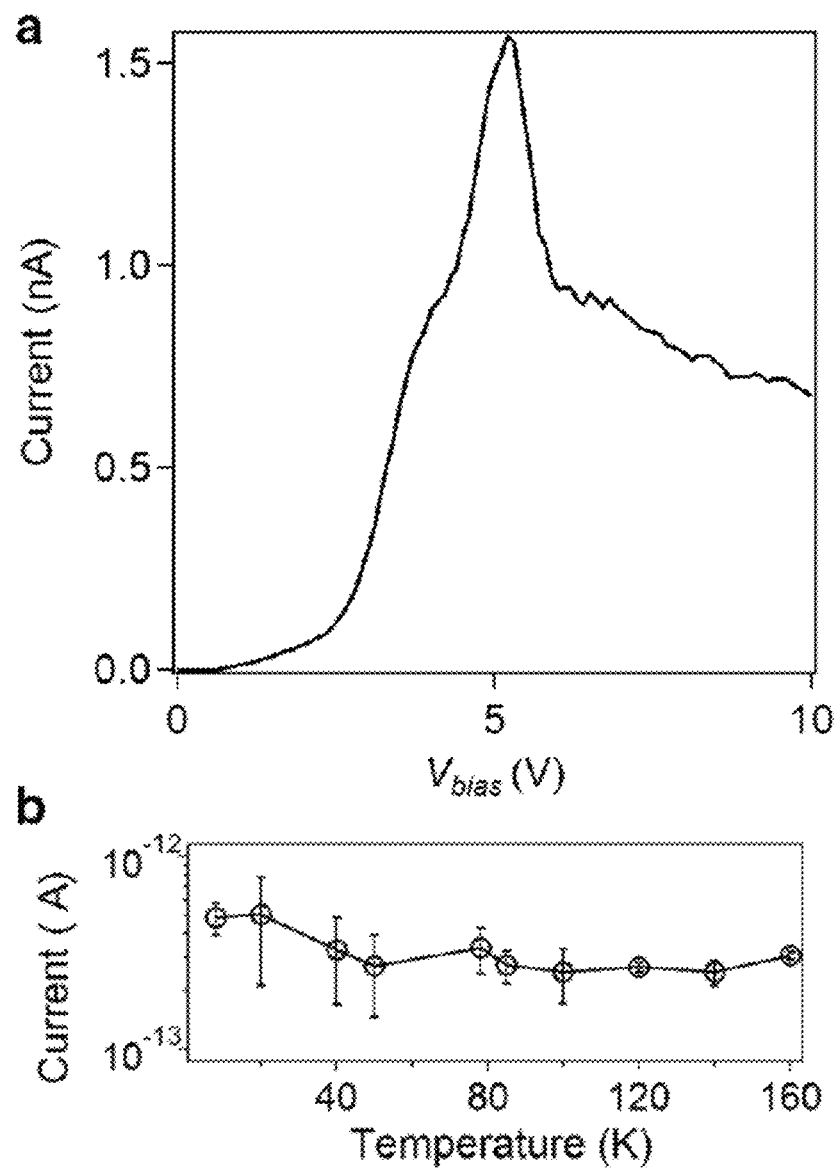
FIG. 3 presents (a) measured nA-scale photocurrent response at 4.2 K and under 0.33 mW Ti:S laser irradiation. (b) Current at a fixed $V_{bias}$ plotted as a function of T. The absence of a thermally activated contribution to the photocurrent response over this range of T as seen in (b) may indicate that the scattering of photoexcited carriers by phonons is not significant.

The temperature dependence of the photocurrent in exemplary CSNWs from 300 to 4.2 K was investigated. The strong NDR feature can also be seen at 4.2 K under higher power monochromatic (0.33 mW) laser illumination, where a nAscale photocurrent and a more than 2:1 peak-to-valley photocurrent ratio are observed [FIG. 3(a)]. While a decrease in the low-bias photo conductance $G_{h\omega}$ under a lamp illumination for decreasing temperature T from 300 to 160 K is seen, there is an absence of systematic variation in $G_{h\omega}$ over the range from~160 to 4.2 K [FIG. 3(b)]. These results indicate that, for T≤160 K, photoexcited carriers are not appreciably scattered by phonons in these devices.

One may compare the probability of hot electrons to undergo RST in the cylindrical core-shell NW geometry to that for a planar structure, i.e., a thin layer of GaAs sandwiched between AlGaAs above and below it. Electron-electron scattering randomizes the momentum distribution while not changing the electron drift velocity. Assuming that the NW diameter (2R) and film thickness (t) in the planar structure are each small in relation to the absorption depth (i.e., the photoexcited electrons are uniformly distributed within the GaAs NW core or thin film layer) and defining an energy relaxation length L within which hot electrons lose energy when entering the AlGaAs shell (or film), the probability of hot electrons created within the GaAs NW core undergoing RST (and the relative degree of tunability) is, to leading order in L, stronger (~L²) than that for the planar geometry (~L).

Figure 4:
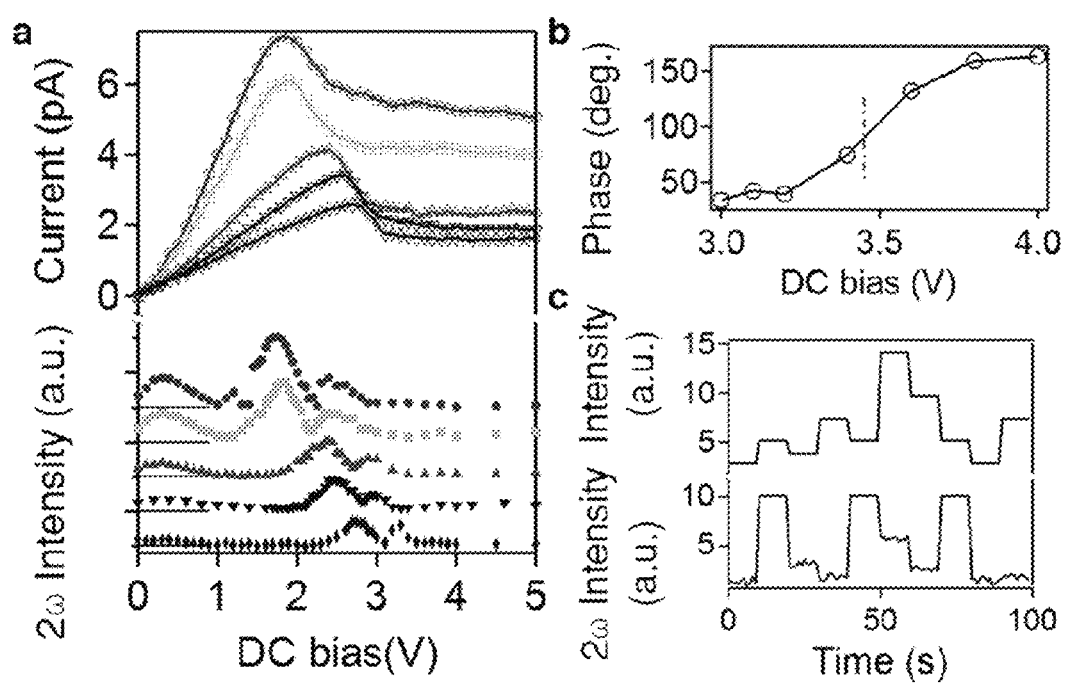
FIG. 4 presents (a) top: photocurrent traces for selected values of incident power: 14.1 mW (red), 9.7 mW (yellow), 5.2 mW (green), 3.9 mW (blue), and 2.85 mW (magenta); bottom: measured 2ω photocurrent signals associated with a small (250 mV) ac voltage modulation (50 Hz) bias applied to the NW about $V_{th}$. (b) Presents a demonstration of control of the photocurrent phase with DC $V_{bias}$ for fixed incident power. The vertical dash-dotted red line denotes the value of $V_{th}$ obtained from a DC I-V trace under identical intensity. (c) Top: arbitrary time series of incident light power selected to shift the value of $V_{th}$ in relation to a fixed $V_{bias}$=2.4 V; bottom: corresponding 2ω signal, demonstrating the optical amplitude modulation of the nonlinear response.
Figure 5:
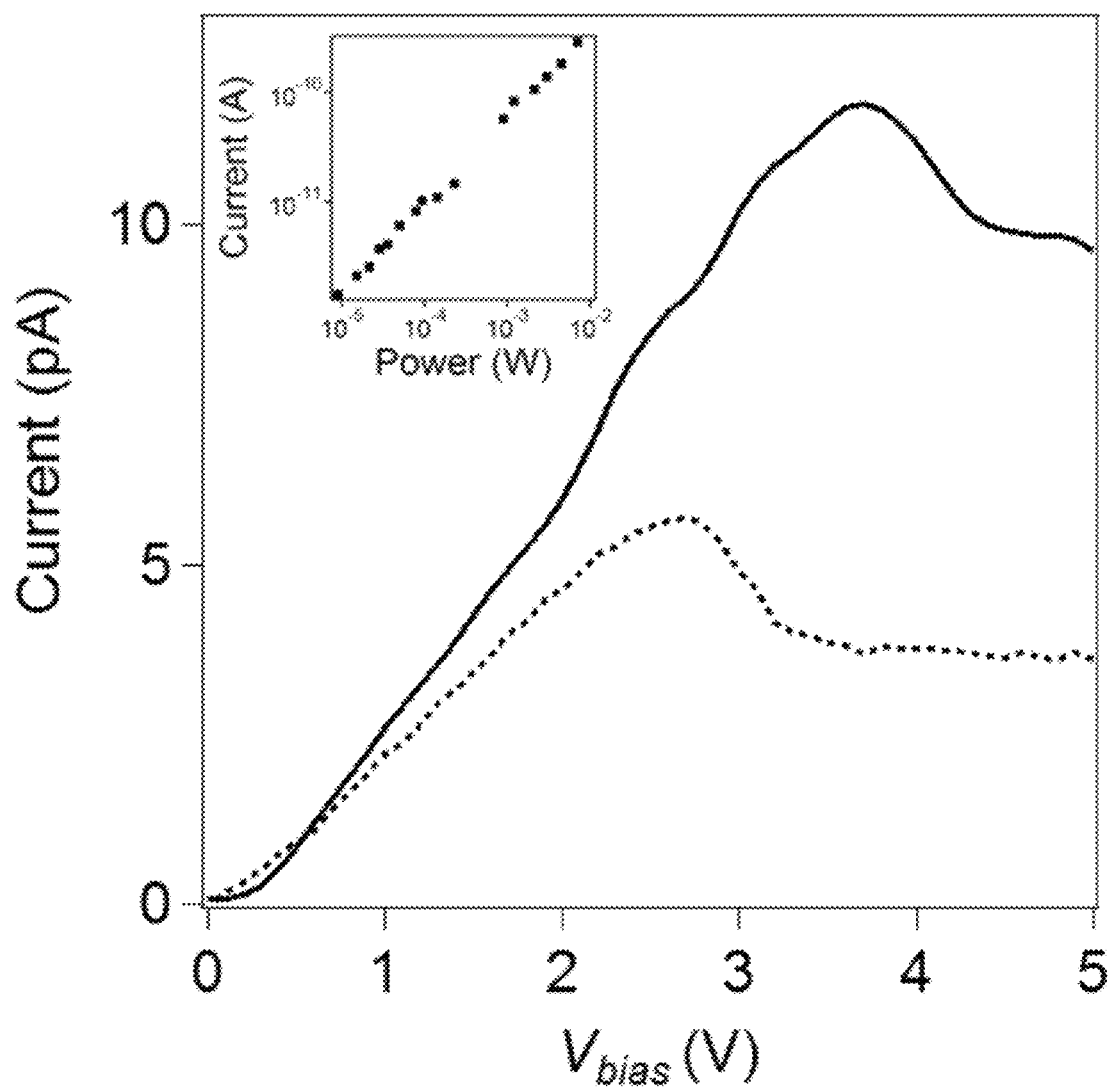
FIG. 5 presents (a)—photocurrent response in the GaAs-core, AlGaAs-shell NW to a focused Ti:S laser (800-nm, 0.14 mW) (solid line), and unfocused 150 W halogen lamp irradiation (dashed), as a function of voltage bias applied between the contacts; inset:—Linear variation of photocurrent with incident optical power (Vbias=2V).
Figure 6:
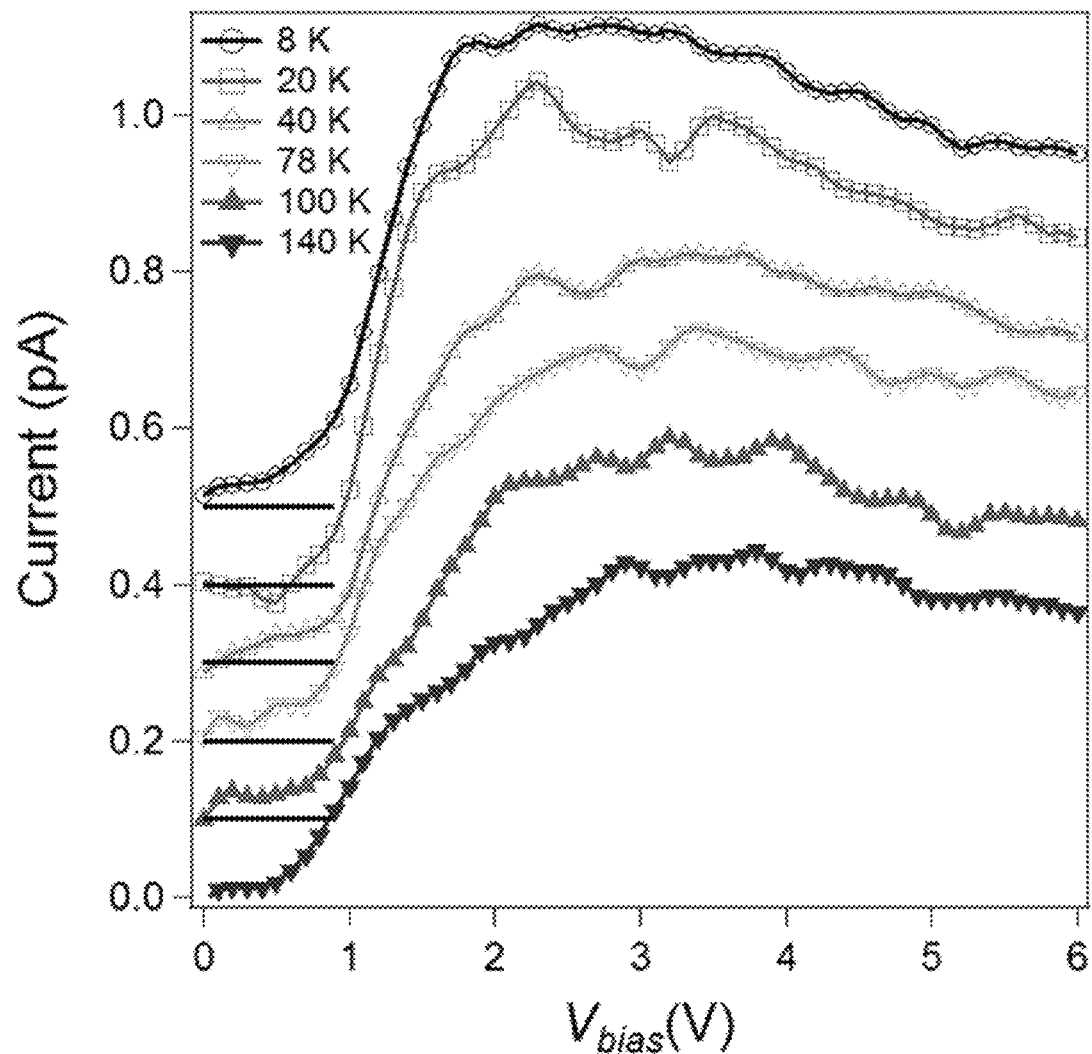
FIG. 6 presents (a) traces of photocurrent versus bias voltage, collected at selected temperature T between 4.2K≤T≤160K, under lamp illumination.

Described here is how the CSNW can be operated as an electrically or optically controllable nonlinear nanoscale device element. For example, in the introduction of an ac modulation to $V_{bias}$ at frequency ω about selected values of $V_{th}$ defined by different values of incident optical intensity, demonstrate full-wave rectification was demonstrated as seen by modulation frequency doubling, and tunability of its maximum along the bias voltage axis [FIG. 4(a)]. For fixed incident power, the phase difference (between that of the ac voltage applied to the sample leads and the generated ac photocurrent) $\Delta\Phi$ can be tuned continuously by bias voltage with $d\Phi/dV \approx 130/=V$ [FIG. 4(b)], demonstrating the potential for these CSNW devices as programmable phase delay elements and for use in frequency multiplication. Further, the 2ω current response to a sequence of arbitrary amplitude light pulses incident upon the CSNW device under ac bias voltage [FIG. 4(c)] demonstrates optical amplitude control of nonlinearity in photocurrent.

The introduction of a single nanoscale element possessing electrically and optically tunable complex impedance presents application to integrated circuits, including oscillators, amplifiers, phase shifters, frequency multipliers, phase-locked loops, and laser switches using fewer and far smaller elements, and with the versatility of a highly local optical interface. Based on the observation of tunable frequency doubling at 1 kHz and on the inherent relaxation time scales for RST of $\sim 10^{-12}$ s, practical GHz-range single nanowire devices exhibiting tunable phase may be constructed, particularly given the evidence of intrinsic picosecond-scale response time characteristics of CSNWs. The dynamic control of hotelectron transfer rates in nanoscale heterojunctions presented here is applicable to photovoltaic devices, where tuning of electron transfer permits more efficient conversion of hot electrons to collected current. Additionally, the reduction in the time scale of a hot-electron transfer from semiconductor nanocrystals approaches the theoretical limit of quantum efficiency for a hot-electron transfer that exceeds the Shockley-Queisser limit.

Figure 12:
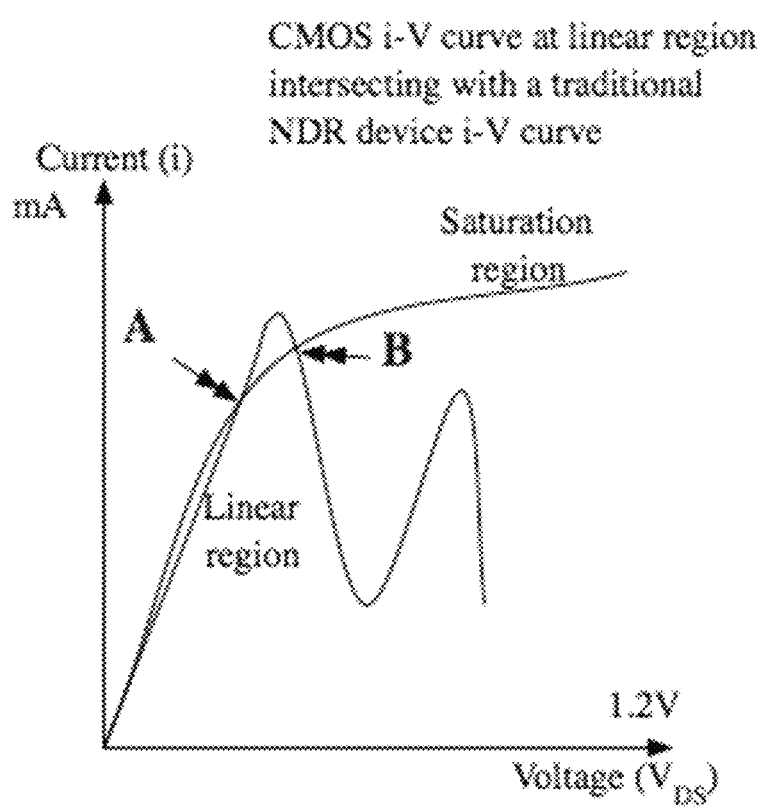
FIG. 12 illustrates CMOS i-V curve at linear region of operation intersecting with a traditional NDR device i-V curve.
Figure 13:
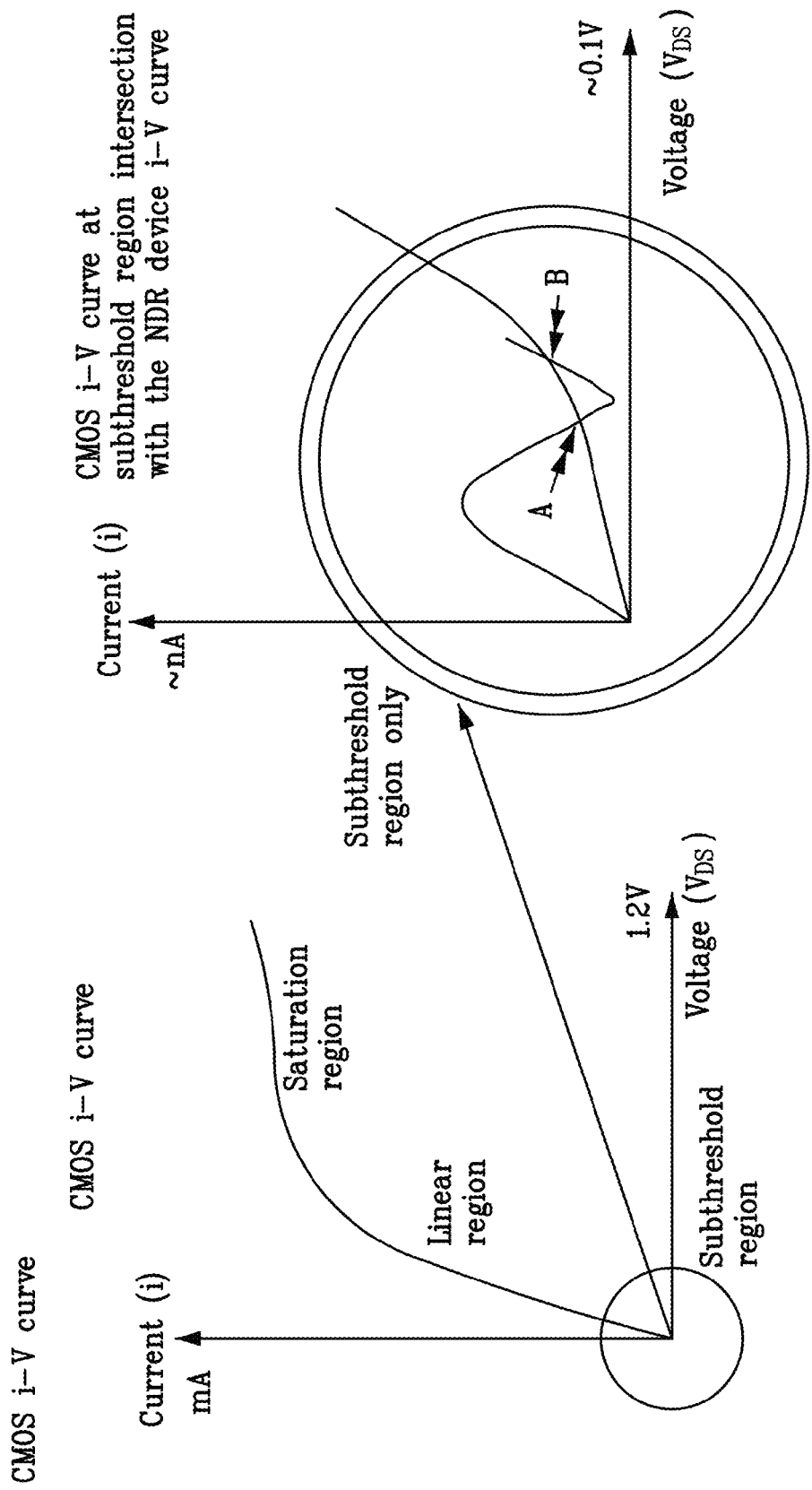
FIG. 13 illustrates CMOS i-V curves at a subthreshold region intersecting with the NDR device i-V curve.
Figure 14:
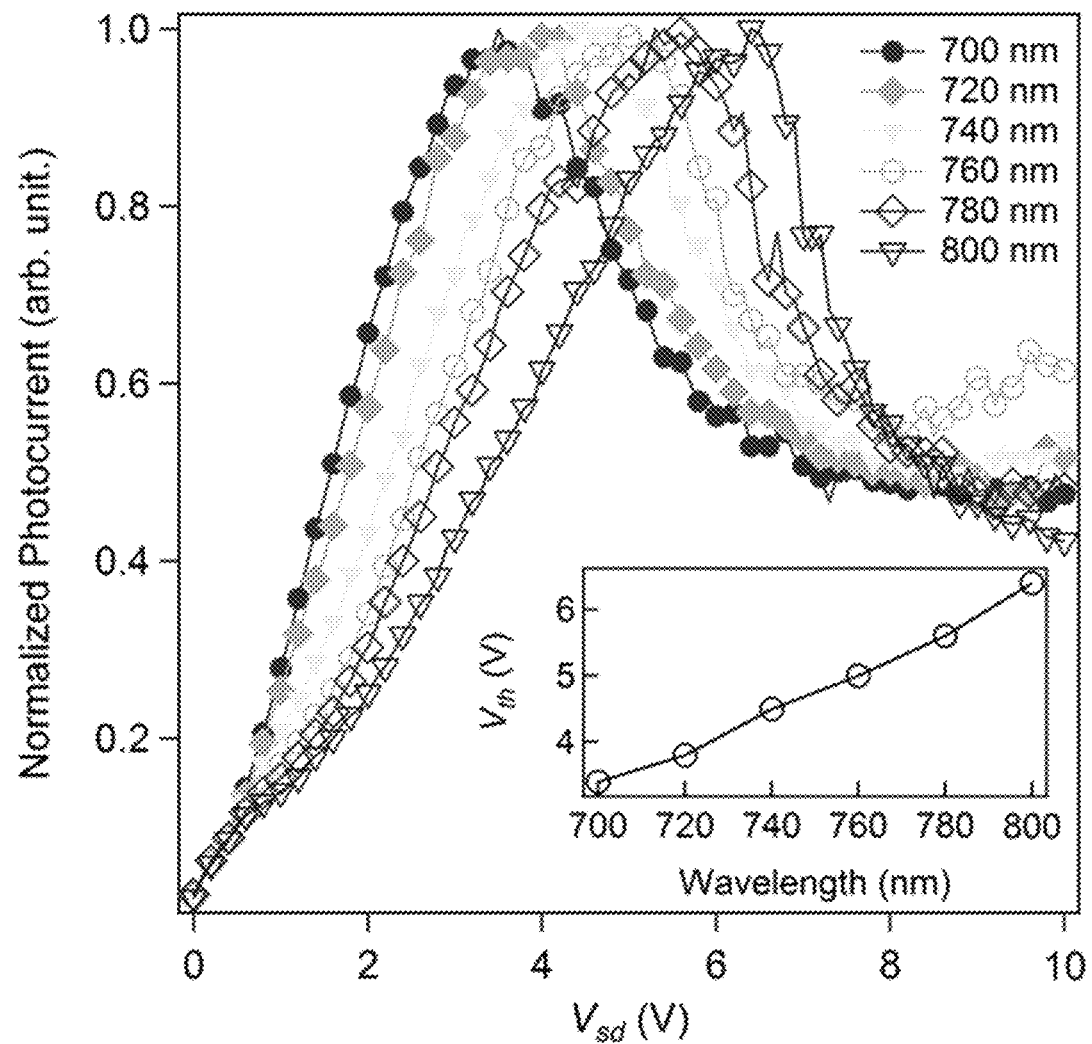
FIG. 14 illustrates results from an exemplary NDR device—the room temperature measurements were under ~200 mW unfocused Ti:Sapphire CW laser illumination. The nanowire under study is GaAs/Al0.24Ga0.76As core-shell nanowires with a diameter of 60 nm and a shell thickness of 70 nm. The results showed a improvement with respect to the wavelength—the figure of merit wavelength tunability of 3e-2 V/nm, which is one order of magnitude larger than the previous 4e-3/V.
Figure 15:
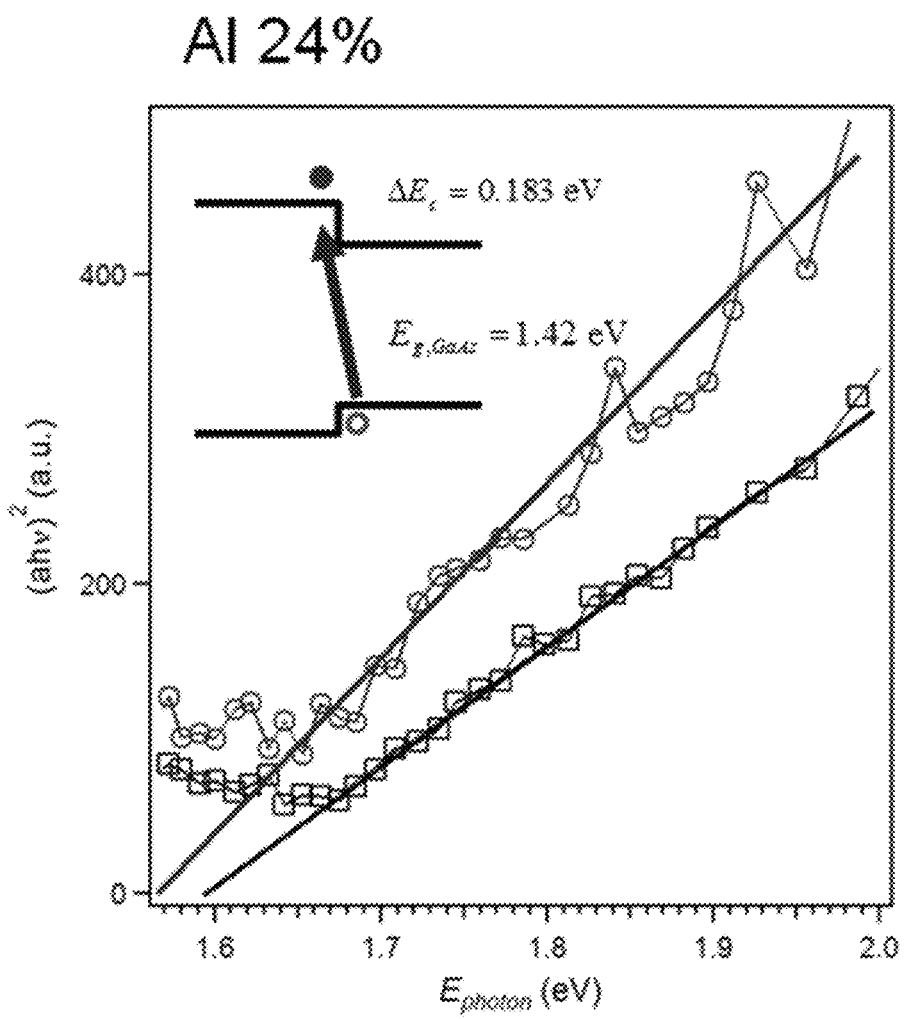
FIG. 15 illustrates a photocurrent spectroscopy study under a supercontinuum pulsed laser source (conduction band-offset on the nanowire heterojunction is about 0.183 eV)

Systems built with Negative Differential Resistance (NDR) devices—such as resonant-tunneling diodes (RTDs)—may include oscillators, analog-to-digital converters and frequency dividers. NDR devices such as RTDs may implement typical logic functionality when integrated with traditional CMOS transistors. Interoperability with CMOS transistors is feasible based at least in part on overlapping operating ranges (of, e.g., voltage, current) with the CMOS transistors. This is illustrated in FIG. 12, where the current-voltage (i-V) curves of a typical n-type CMOS transistor overlaps with an NDR device. The points of intersection, A and B, are used to achieve circuit functionality.

These tunable hit electron transfer-based NDR devices operate with currents in the nanoamps range, and may not permit the overlap of the current-voltage curves at the same scale (of voltage, current). Overlap is possible at the subthreshold range of operation for the CMOS transistor. The subthreshold range of operation for CMOS transistors is an ultra-low power operating mode that is most suitable for data processing in in-vivo or field-deployable sensors with limited power budgets. The interoperability with tunable core-shell nanowire-based NDR devices presents opportunities for direct integration of the proposed NDR devices in such sensing systems, with the added value of tenability. The tunability may improve 1) the accuracy of measurement, by tuning the NDR device operation in real-time over a single measured sample to get multiple readings, 2) the range of measurement, by tuning the NDR device in real-time over a single measured sample to make the measurement feasible.

Figure 21:
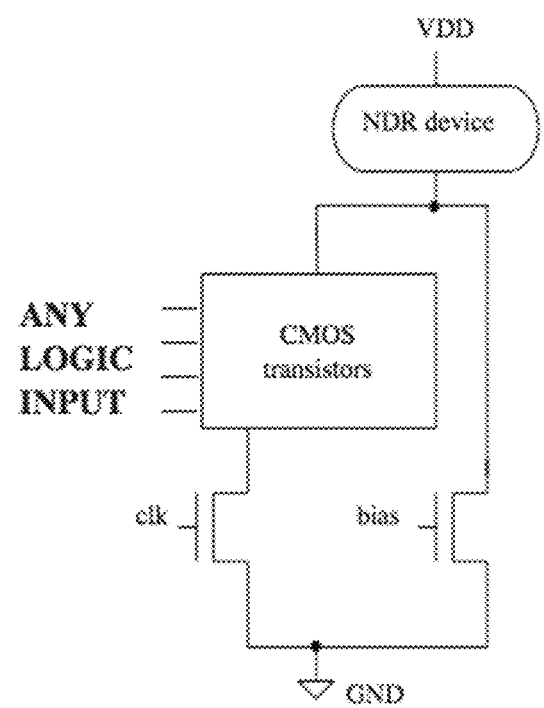
FIG. 21 illustrates a method of integrating integrate CMOS transistors with NDR to implement any logic function, such as NAND, NOR, INV. The "CMOS transistors" block may be designed as a "CMOS pull-down section" [Rabaey] to implement the desired logic functionality from the logic inputs. The two transistors driven by clk and bias voltages are also n-type CMOS transistors (i.e. NMOS)
Figure 22:
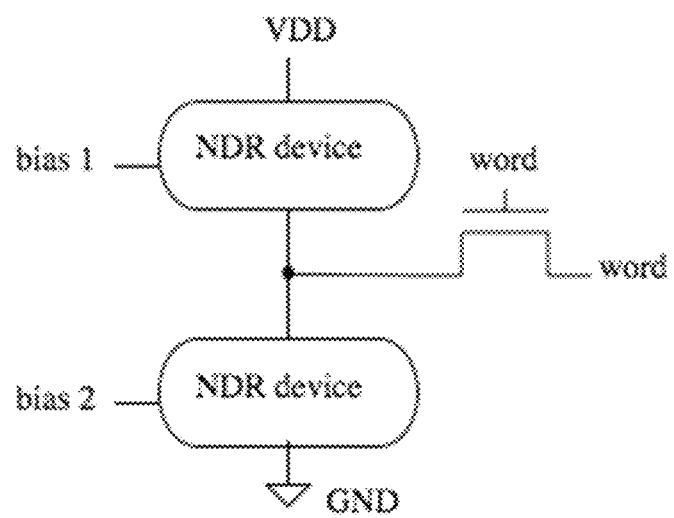
FIG. 22 illustrates an exemplary method to integrate an n-type CMOS transistor with NDR devices to implement a one-bit memory. Similar to CMOS memory, the bit storage is stackable for high density and addressable by the word input from a row of bits.

The subthreshold operation of the CMOS transistors, which are interoperating with the NDR devices, enables ultra-low power operation of the integrated systems. This is unlike typical systems that integrate NDR devices, as RTD based NDR devices do not necessarily permit subthreshold operation. Likewise, RTD-based NDR devices and other NDR devices do not necessarily permit tunable operation. Exemplary integrations of CMOS with NDR are shown in FIGS. 21 and 22. In FIG. 21 is shown a method of integrating CMOS transistors with NDR to implement any logic function, such as NAND, NOR, INV. The "CMOS transistors" block may be a "CMOS pull-down section" to implement the desired logic functionality from the logic inputs. The two transistors driven by clk and bias voltages are also n-type CMOS transistors (I.e. NMOS). In FIG. 22 is shown a method of integrating an n-type CMOS transistor with NDR devices to implement a one-bit memory. Similar to CMOS memory, bit storage is stackable for high density and addressable by the word input from a row of bits.

Additional Disclosure

Nanowire Growth and Analysis

Taper-free GaAs/Al$_{0.33}$Ga$_{0.67}$As core-shell NWs were grown using colloidal Au-nanoparticle-catalyzed metalorganic vapor phase epitaxy on 111(B)-terminated GaAs substrates. The growth of GaAs NW cores having diameters ranging from 50 nm-70 nm was carried out using (CH$_3$)$_3$Ga and (C$_4$H$_9$)AsH$_2$ as metalorganic precursors at a growth temperature of 400° C., and AlGaAs shells with thickness ranging around 70-80 nm were subsequently grown at 650° C. with the addition of (CH$_3$)$_3$Al.

Exemplary Device Fabrication and Electrical Characterization

NWs were transferred onto p-type degenerately-doped Si(100) substrates each possessing a 200-nm thermally-grown SiO2 gate oxide following sonication in isopropyl alcohol. Areas of contacts on NWs were defined using electron-beam lithographic patterning. The contact separation (2 µm) and contact width of each of the devices was identical to within the resolution of the lithography. An oxide removal and shell etch was performed on the exposed NWs with HCl for 1 minute followed by H$_2$SO$_4$/H$_2$O$_2$/H$_2$O (1:8:1000) solution for 30 seconds in order to ensure contact to the NW core. Metal contacts were deposited by electron-beam evaporation of Pd/Zn/Pd trilayers, 10 nm/20 nm/20 nm immediately afterwards. A lift-off processed in acetone completed the lithography procedures. The as-contacted devices were subjected to a rapid thermal annealing at 400° C. in forming gas (5% H$_2$/95% N$_2$) for 20 seconds. Substrate electrostatic gating was facilitated by Ni-Au contacts deposited prior to NW device processing.

Electronic transport measurements were collected from 4.2K-300 K at<$10^{-5}$ torr in the dark and under optical illumination by an unfocused 150 W halogen lamp, and under illumination by a continous-wave Ti:S laser at a photon energy (1.554 eV) between the direct gaps of GaAs and Al$_{0.33}$Ga$_{0.67}$As (1.42 and 1.8 eV, respectively), and at selected values of laser power (1 µW-30 mW) using a function generator (Agilent 33120), picommeter (Keithley 6487), and a lock-in amplifier (SRS830). Optical power was measured using a Newport 1830-C power meter with a model 883-SL calibrated detector.

Calculation of Transfer Fraction $f$

The relation $dJ_{h\omega}/dE = q\delta n[\mu_1 - f\Delta\mu - (df/dE)\Delta\mu E]$ permits an estimation of the variable f at $V_{th}$ as a function of electric field E and thus $V_{bias}$. For example, one may derive the f-$V_{th}$ relationship at various gate voltages $V_g$ and compare the results with the experimental data. It is obvious that $V_{th}$ is reached when $dJ_{h\omega}/dE=0$, which leads to $$\frac{\mu_1}{\Delta\mu} = f + E\frac{df}{dE}$$

As a first-order linear ordinary differential equation, the general solution can be written as $$f = \frac{\mu_1}{\Delta\mu} + \frac{C}{E_{th}} = \frac{\mu_1}{\Delta\mu} + \frac{C''}{V_{th}}$$

where C and C$^1$ are integration constants and C$^1$=Cl, and l denotes channel length.

Experimentally, f at $V_{th}$ can be expressed as $(I'_{V_{th}} - I_{V_{th}})/I_{V_{th}}$ where I' is the linear-fitting function from nearly linear region at small $V_{bias}$.

Figure 7:
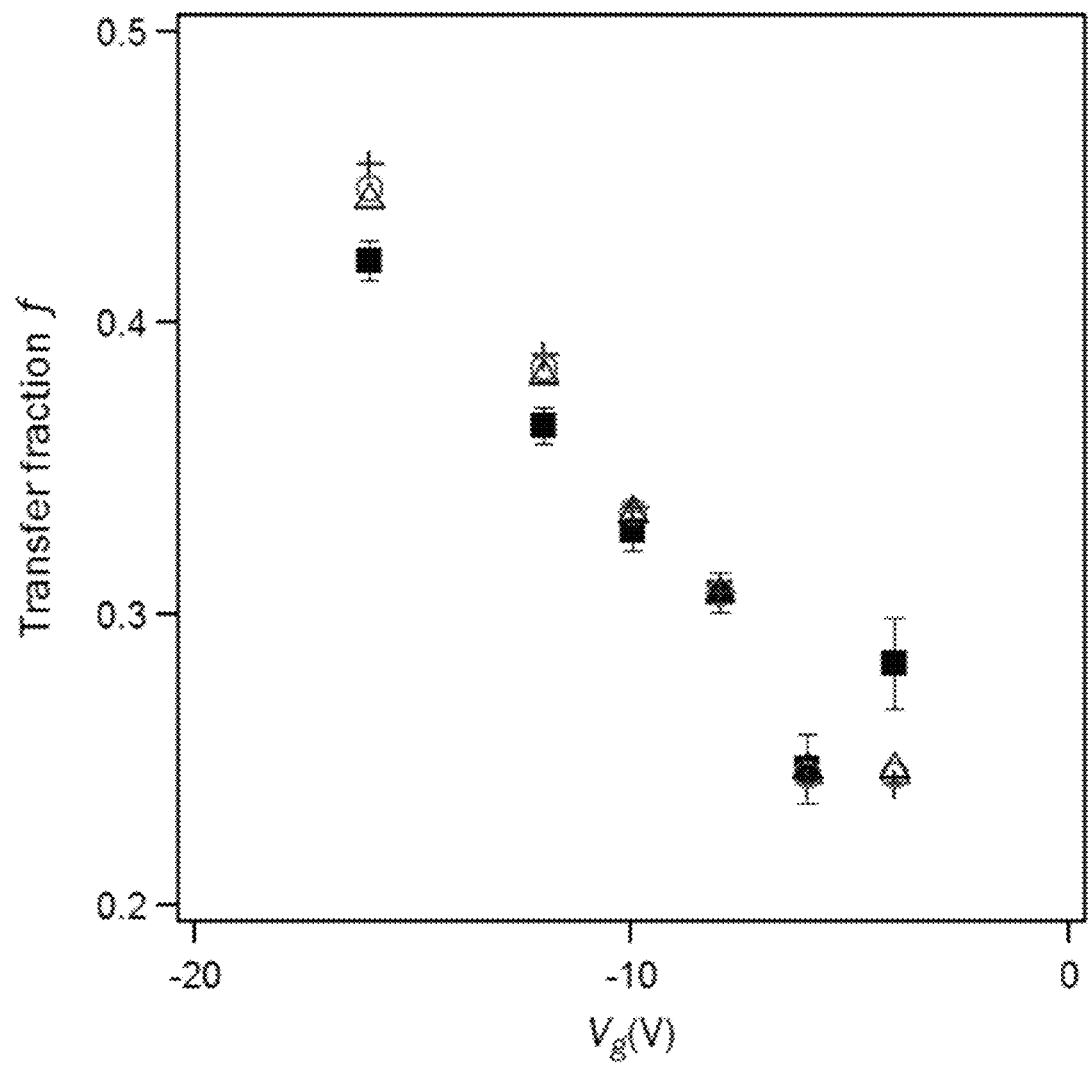
FIG. 7 presents a comparison between experimental results and calculation of ƒ-V9 relationship. Determination of parameter ƒ from experimental data is denoted in black squares. Red crosses, green circles and blue triangles corresponds to calculation results using selected different values of μ2 (500, 200 and 50 cm² V⁻¹ s⁻¹, respectively).

By inserting one experimentally determined initial value, one may obtain a special solution and construct the relationship between $f$ and $V_{th}$. In FIG. 7, a comparison of $f$-$V_g$ between experimental results and direct calculation (under several selected $\mu 1/\Delta\mu$ values) is given. The calculation showed a close agreement with the experiment. A range of values of shell mobility differences were considered; the change of $\mu 1/\Delta\mu$ in calculation showed that a larger $\Delta\mu$ yields the best agreement among the values considered.

Figure 8:
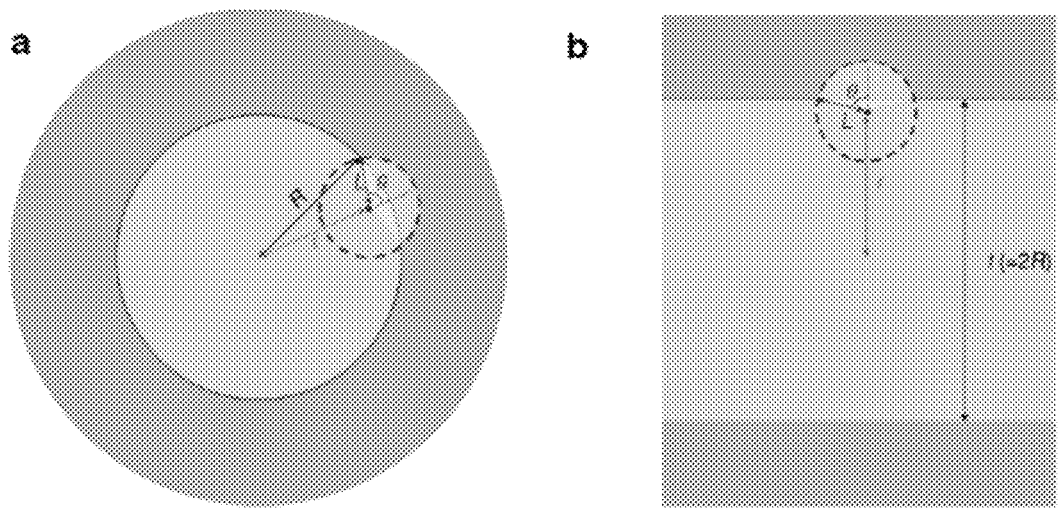
FIG. 8 presents a schematic illustration denoting energy relaxation length L in relation to NW core diameter and planar layer thickness 2R.

Geometrical Considerations in Comparing RST in Cylindrical Core-Shell NW and Planar Heterojunctions Heterojunction interface shape is a consideration in the probability of hot electrons to undergo RST; one may consider the cases of the cylindrical GaAs core-AlGaAs shell (FIG. 8(a)) and the planar structure—a GaAs layer of thickness $t(=2R)$ sandwiched between layers of GaAs (FIG. 8(b)). One may assume that electron-electron scattering randomizes the momentum distribution while not changing electron drift velocity, and one may assign an energy relaxation length L for hot electrons to lose the additional energy to enter the AlGaAs shell.

One may assume that the NW core diameter 2R and GaAs film thickness t are each small in relation to the optical absorption depth so that the density photo-excited electrons is uniform within the GaAs NW core (film), but large in relation to the Bohr excitonic radius. While $\nabla V$ $(r)\neq 0$ in the core (and $\nabla V$ $(z)\neq 0$ in film) near their respective heterojunction interfaces, the form of V (r) (V (z)) is not known a priori and it is omitted in the present model for simplicity. Defining the hot electron density as $\rho$, within the cross-sectional area of a core-shell NW (FIG. 8(a)) for electrons located on a cylindrical surface at a distance of r to the center, the electron density per unit length is $2\pi r\rho\, dr$. One may define a sphere of radius equal in value to the energy relaxation length L centered on any point on this surface. The solid angle over which the sphere intercepts the core-shell interface can be expressed as $$\Omega(r) \approx 2\pi(1-\cos\theta) = 2\pi\left[\frac{(r+L)^2 - R^2}{2rL}\right].$$

RST occurs only for the fraction of hot electrons having vector components of momentum that fall within the angular range denoted in yellow in FIG. 8(a). The probability of a hot electron to enter the shell is then $$f(r) = \frac{\Omega(r)}{4\pi} = \frac{(r+L)^2 - R^2}{4rL}.$$

The total number of electrons in the GaAs core that undergo RST is thus $$N_{NW} = 2\pi\rho \int_{R-L}^{R} rf(r)\,dr = \frac{\pi}{2}\rho\left(\frac{L^2}{3} + RL\right).$$

Using a similar argument the total number of electrons in the planar structure (FIG. 8(b)) having the same cross-sectional area that undergo RST is $N_{planar}=(\pi/4)\rho tL$, and so $N_{NW}$ is always larger than $N_{planar}$. Even for the case $2R\gg L$ in which the electrons which can enter AlGaAs are limited to a thin layer adjacent to heterointerface, it is seen that $N_{NW}=2N_{planar}$. Though coupling of electrostatic gating, incident photon flux, and incident photon wavelength on RST and transport characteristics in the planar geometry cannot be ruled out, such effects have not been reported previously. Significantly, the stronger, quadratic (compared with linear) power law dependence of NNW in L compared with Nplanar owing to the larger fraction of hot electrons that can participate in RST suggests that the application of electrostatic gating, incident photon flux or incident photon wavelength modulation has a larger effect on the character of the RST.

Demonstration of Optical Modulation under Ti:S Laser

Figure 9:
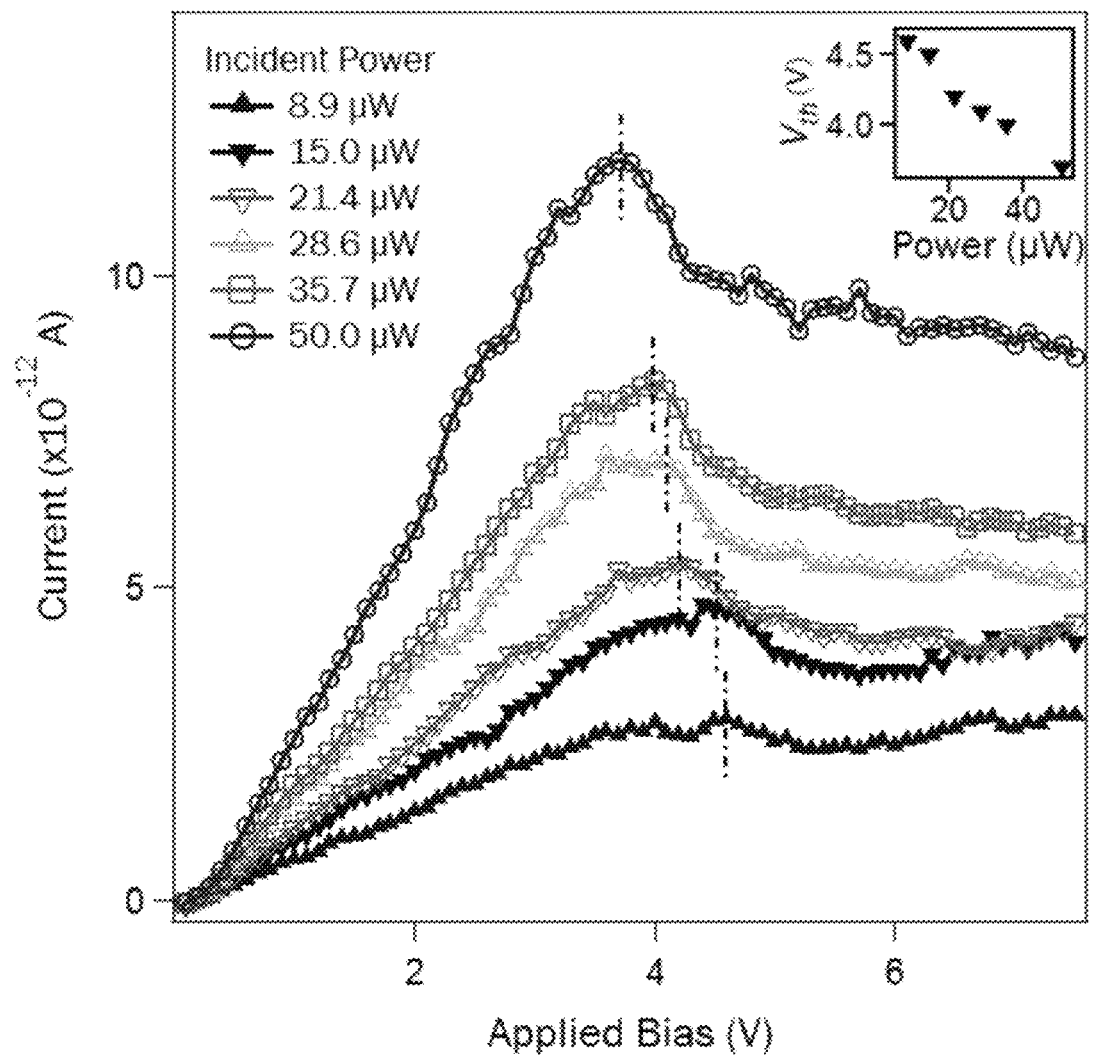
FIG. 9 presents photocurrent-voltage traces from Ti:S laser illumination for different values of incident power. Vertical dash-dot lines denote the NDR onset biases $V_{th}$ for each trace.

Tunable optically-controlled NDR is also seen under low-intensity monochromatic (e.g. 800 nm) Ti:S laser illumination. As shown in FIG. 9, a negative $dV_{th}/dI_{h\omega}$ is verified and $V_{th}$ shifted by approximately 1V over the range of incident power of 41.1 µW.

Device Response under Laser Irradiation and at 1 kHz

Figure 10:
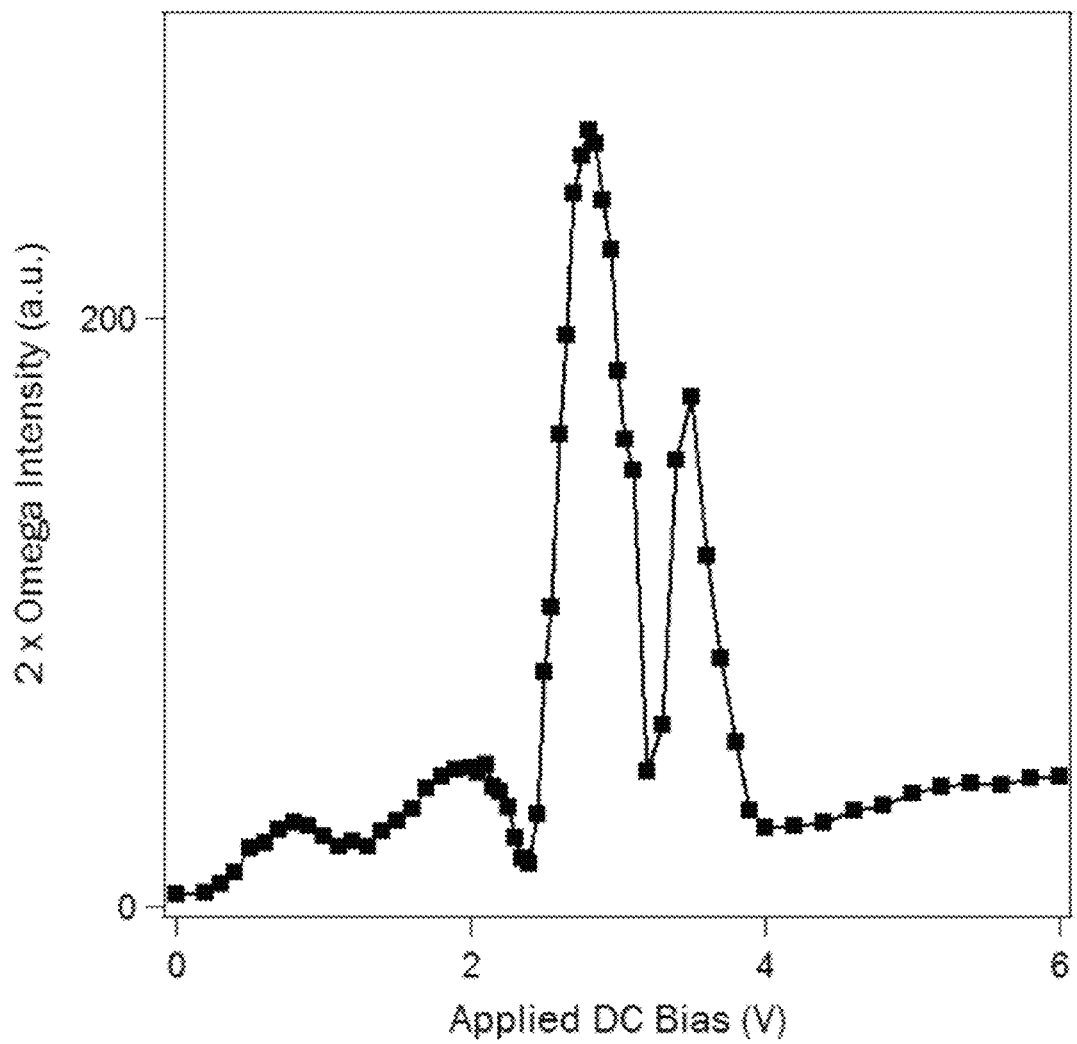
FIG. 10 presents 2ω signals under a 250 mV ac voltage superimposed on the DC bias at ω=1 kHz.

Demonstration of frequency-doubling is presented elsewhere herein. Despite limits from parasitic capacitance, devices are shown to be capable of operating up to 1 kHz at 300K when significant $2\omega$ maximum at $V_{th}$ still remains under high power (30 mW) Ti:S laser (800 nm) illumination when ac component of the photocurrent is sufficiently large compared to the ac current in the parasitic loop (FIG. 10).

Optical Polarization Effect

Figure 11:
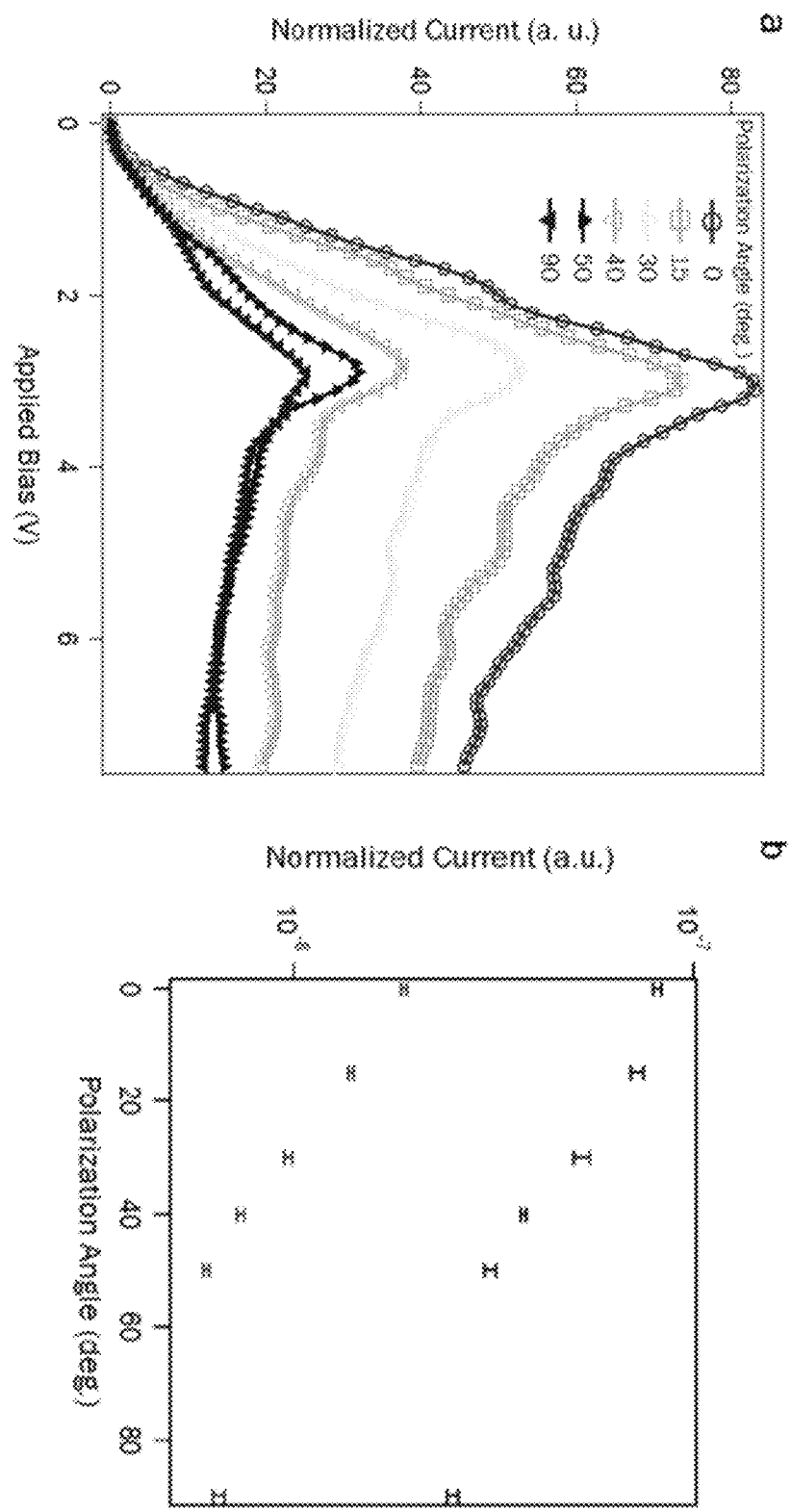
FIG. 11 presents: Polarization-dependent photocurrent. (a) Normalized photocurrent with polarization angle (relative to NW axial direction); (b) selected normalized photocurrent vs. polarization angle at $V_{bias}$=1 V (red) and $V_{bias}$=$V_{th}$ V (black)

These CSNWs that feature RST-based NDR in their photocurrent-voltage traces also exhibit bias voltage-independent polarization-sensitive response (FIG. 11a,b) under 800-nm Ti:S laser irradiation. Shown in FIG. 11a are the measured photocurrents for different values of incident polarization angle with respect to the NW axis, where the traces are normalized by the laser power since by changing the polarization, the power changed slightly as well. The variation with angle is consistent with published reports of polarization-dependence in photocurrent in single nanowires as well as core-shell nanowires.

Presented here for exemplary purposes, is used electron beam induced current (EBIC) to map the spatial distribution of photocurrent. EBIC and SPC are complementary to each other in excess carrier generation, although EBIC may in some embodiments have a better spatial resolution up to a few nanometers. The techniques may be used for studying the interface properties of semiconductor heterostructure. Features on nanowire devices with a channel length smaller than 2 µm and on radial direction may be observed with EBIC measurements.

GaAs/$Al_{0.24}Ga_{0.76}$As NWs used in the exemplary study are grown by Au-nanoparticle-catalyzed MOVPE method on 111(B)-terminated GaAs substrates. The growth of GaAs NW cores having diameters of 60 nm was carried out using $(CH_3)_3Ga$ and $(C_4H_9)AsH_2$ as metalorganic precursors at a growth temperature of 400° C., and AlGaAs shells with thickness ranging around 70 nm were subsequently grown at 650° C. with the addition of $(CH_3)_3Al$. The low temperature photoluminescence (PL) is used to estimate the Al percentage from shell band edge excitonic emission. The core may be lightly p-typed unintentionally doped with carbon from the precursors. The shell, on the other hand, is n-typed doped with Si.

The devices are defined with e-beam lithography and the metallization process is conducted in an e-gun evaporator. All devices are subject to gentle oxygen plasma cleaning for 5-15 minutes before the measurement inside a FEI DB235 FIB-SEM chamber to avoid residue carbon deposition in the vicinity to the beam.

Figure 16C:
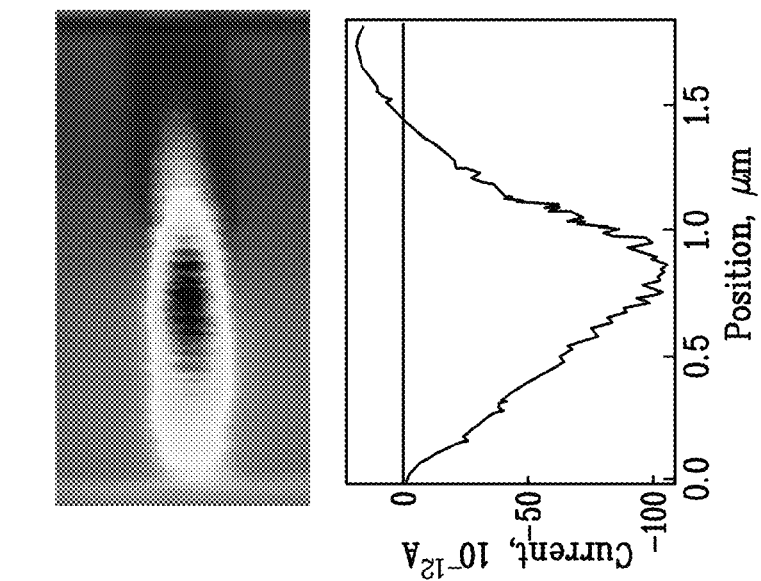
FIG. 16 illustrates characterizations on ohmic-contacted devices. (a) I-V characteristics of a NW device under equilibrium (squares) and broad-band illumination (circles). Inset: SEM image of a device. (b) Gate coupling on conduction from a back-gate electrode. Inset: the extracted transconductance over applied source-drain biases. (c), EBIC mapping at 10 kV of one representative unbiased device (top) with a line profile taken from the center axis of the NW (bottom)
Figure 16B:
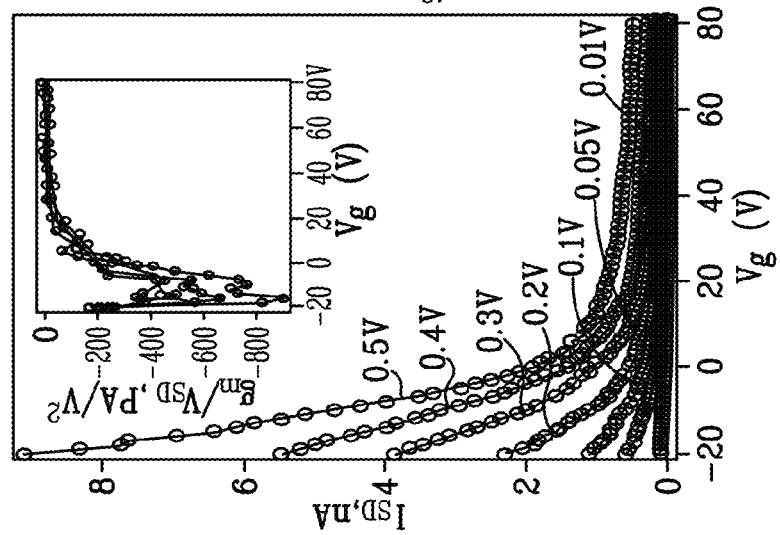
Figure 16A:
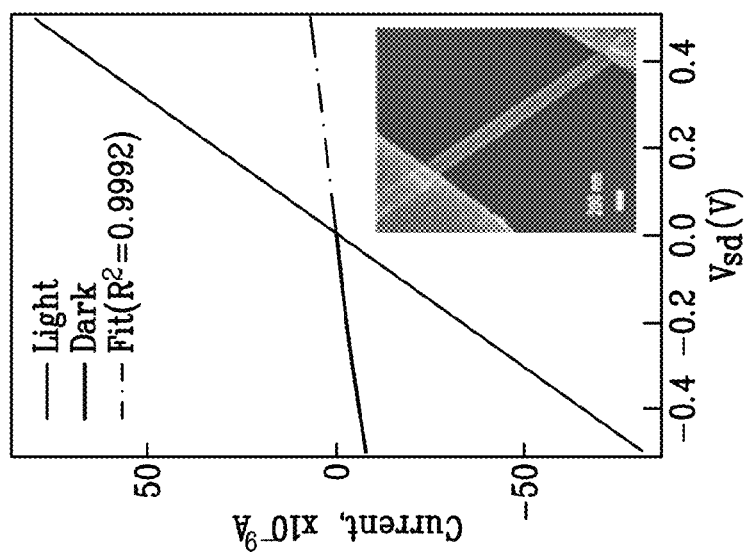

The devices under EBIC study exhibited Ohmic contact on the core from an optimized contact with functional metal layer consisting of Pd and Zn. The out-diffusion of Ga through Pd, activated by a rapid thermal annealing at 400 deg. C. leaves vacancy for Zn to occupy and to form local doping under the contact area. The contact resistance is lowered by 100-fold compared to Ti/Au contact. The I-V characteristics under equilibrium have correlation coefficients ($R^2$) of linear fit close to unity (FIG. 16a). The back-gate results confirmed that the nanowires are p-type doped in the core and from that a field-effect hole mobility of 13 $cm^2/V^{-s}$ is estimated based on nanowire back-gate transistor model. The value is expected to be lower than the intrinsic core mobility due to the shielding effect from the shell. The EBIC results are consistent with a typical Ohmic contacted device which have anti-symmetric shape current[12] versus channel position relationship (FIG. 16c). The zero current points are usually not at the center of the nanowire due to experiment circuit DC offset in the system circuit and the difference between the two contact resistances.

Figures 17A, 17C, 17D:
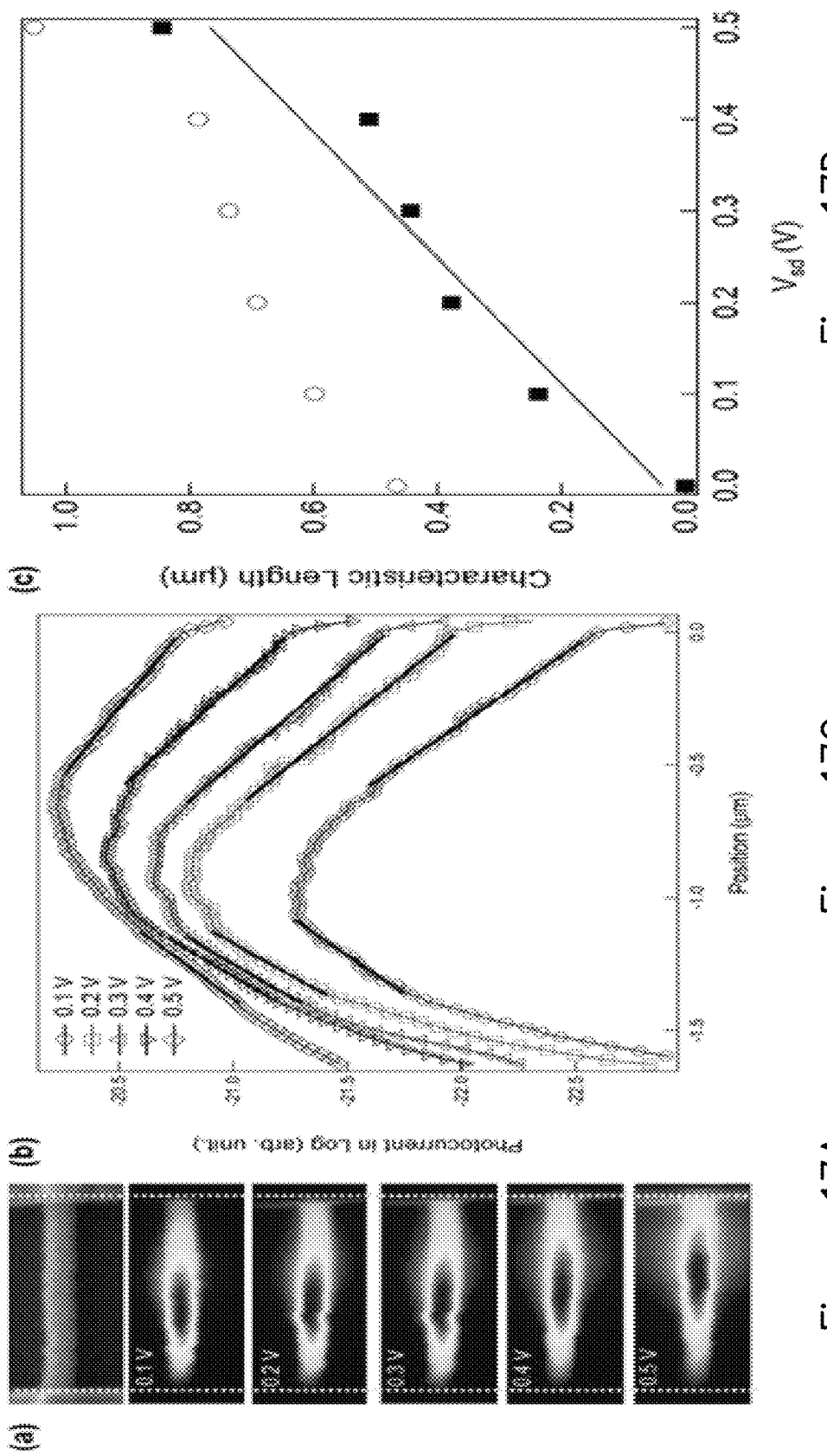
FIG. 17 illustrates EBIC measurements at 5 kV under bias (the right side is always grounded). (a) EBIC mapping of a single NW device at Vsd=0.1, 0.2, 0.3, 0.4, and 0.5 V. (b) The line profiles along NW axial direction. Line fittings are shown in solid lines (black) on both sides of the EBIC signal maxima. (c) The drift components (solid squares) are separated from the diffusion-drift decay lengths (open circles) by a fitting using eq 3 (the result spatially resolves the diffusion/drift characteristic length and shows a clear revolution of the drift component with applied source-drain bias. The measurement is under a 5 kV electron beam in a FEI DB235 system)

When the device is biased, the EBIC signal is enhanced due to the drift current of the majority carrier with a peak, corresponding to the turning point from electron-limited current to hole-limited current. The sign of the current over the entire nanowire is unidirectional as a result. When the bias is increased, the EBIC peak shifts toward the hole collector which confirms that hole current is the limiting factor for overall signal. The effect of drift becomes more significant at higher bias. One may first investigate the low kV case where the e-beam interacts mostly with the surrounding shell on the beam path and dissipates most of the energy. In FIG. 17, the study under a 5 kV beam is summarized.

When bias increased from 0.1 V to 0.5 V, the electron diffusion length extracted by exponential fitting evolves from 0.60 μm to 1.05 μm and the hole diffusion length from 0.31 μm to 0.68 μm. The finding clearly evidences a drift current being coupled into the diffusion one which is dominant at zero or low bias. The extracted values are also typical for AlGaAs with Al~24%. Under the effect of an external electric field, the symmetric diffusion of carriers from a point injection will be disturbed and the diffusion length is altered, with those along the field extended and those against the field shortened. A more quantitative approach can be understood from the diffusion-drift continuity equation with drift term associated with mobility and electric field.

$$L_n^2 \frac{\partial^2 \Delta n}{\partial x^2} - L_{drft,n} \frac{\partial \Delta n}{\partial x} - \Delta n = 0 \quad (1)$$

In the equation, drift length is introduced as $L_{drft,n} = \mu_n E \tau_n$. $L_n$ denotes pure diffusion length and $\Delta n$ is the excess carrier concentration. Under stead-state injection as boundary conditions, the solution for a decay length along the field is in the following form.

$$L_1 = \frac{2L_n^2}{\sqrt{L_{drft,n}^2 + 4L_n^2} - L_{drft,n}} \quad (2)$$

It is obvious that $L_{drft,n} \ll L_n$ at zero or low bias scenarios therefore $L_1 \approx L_n$. If the field is extremely large, the drifting component will be dominant as $L_1 \approx L_{drft,n}$, although not possible in a real material due to sublinear μ-E relationship in high field regime. Nevertheless, the bias applied will not fall into a high-field range and one may find the analytical formula describes the results nicely. If one inversely solves $L_{drft,n}$ from eq 2, one has results fit to the following eq 3 showing in FIG. 2c.

$$L_{drft,n} = L_1 - \frac{L_n^2}{L_1} \quad (3)$$

This result gives a μτ product of $2.78 \times 10^{-8} cm^2/V$ for electrons in the AlGaAs shell.

When the EBIC is collected at a higher beam voltage of 10 kV, the beam interaction volume overlaps the GaAs core area. The overall EBIC signal at the center will be contributed from both the GaAs core, which is expected to have much higher electron mobility, and the surrounding AlGaAs shell. The shell thickness is comparable to the core diameter and the EBIC signal from the shell might be the dominant component. A more precise estimation of the ratio of e-h pair generation rates between the two regions requires a monte-carlo simulation of scattering events and the trajectory path of energy loss. The long decay length in GaAs core will not be directly resolved from the overall signal. Nevertheless, the averaged diffusion/drift length is expected to increase as a result. In FIG. 18a the evolution of the decay lengths at several biases is given. The total decay length increased by ~35% and the derived drift length by ~100%.

Figure 19:
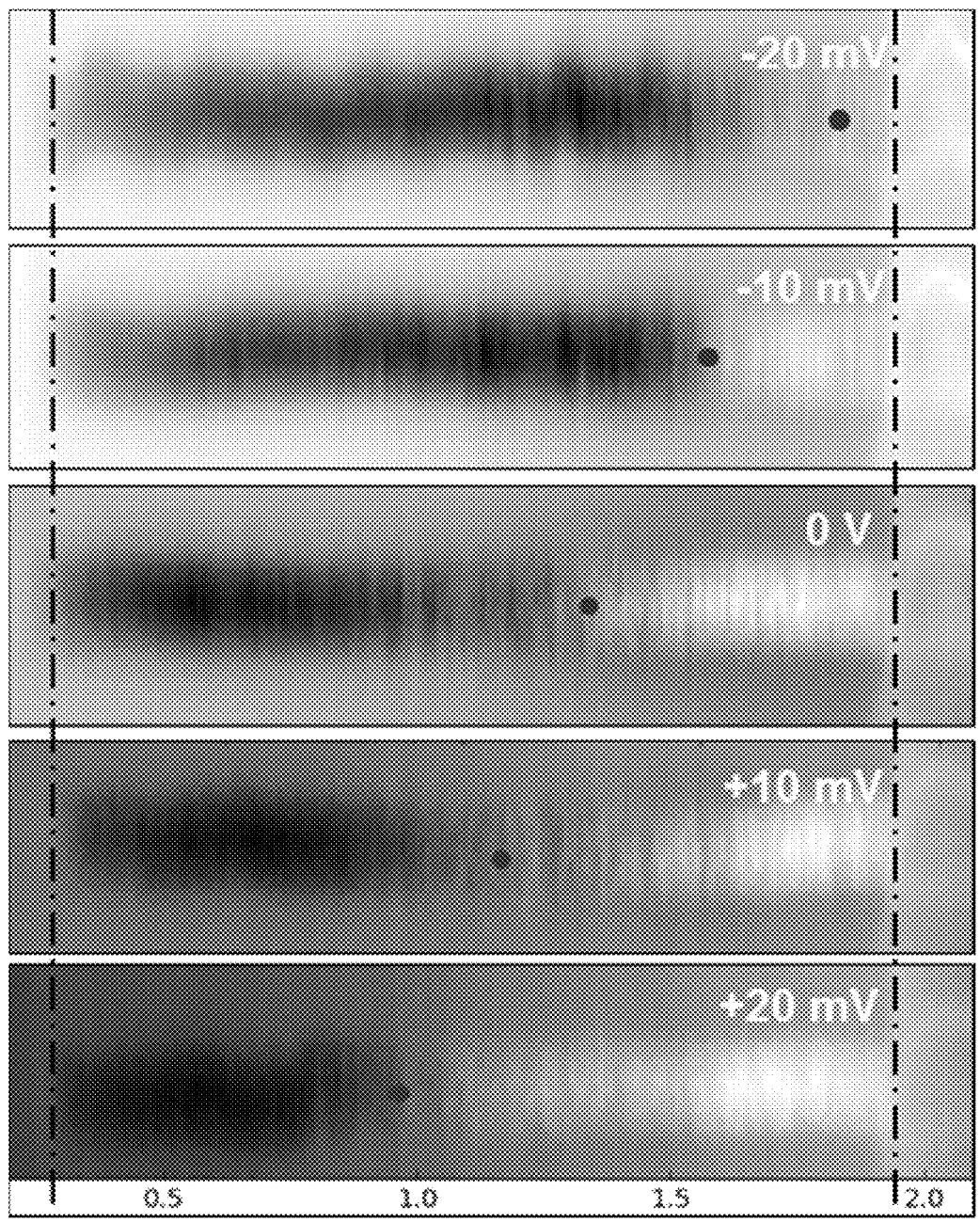
FIG. 19 Low-bias evolution in the vicinity of 0V for an exemplary device. The red dots indicate the point when EBIC signal changes sign.

From zero to a considerable bias (e.g., 0.1 V), the EBIC axial line profiles change from anti-symmetric, in which the diffusion dominates the transport, to a peak shape with same sign of excess current and having nearly exponential decay on both sides. In FIG. 19, a series of EBIC mapping with an increment of 10 mV is shown. By increasing the applied bias from negative to positive in the vicinity of zero-bias, a continuous shift of the antisymmetric point by 1.2 μm over 40 mV is evident. At even higher positive (negative) bias, the negative (positive) part of the signal will be merged into the corresponding contact and the entire profile evolves into FIGS. 17b and 18c.

Figure 20A:
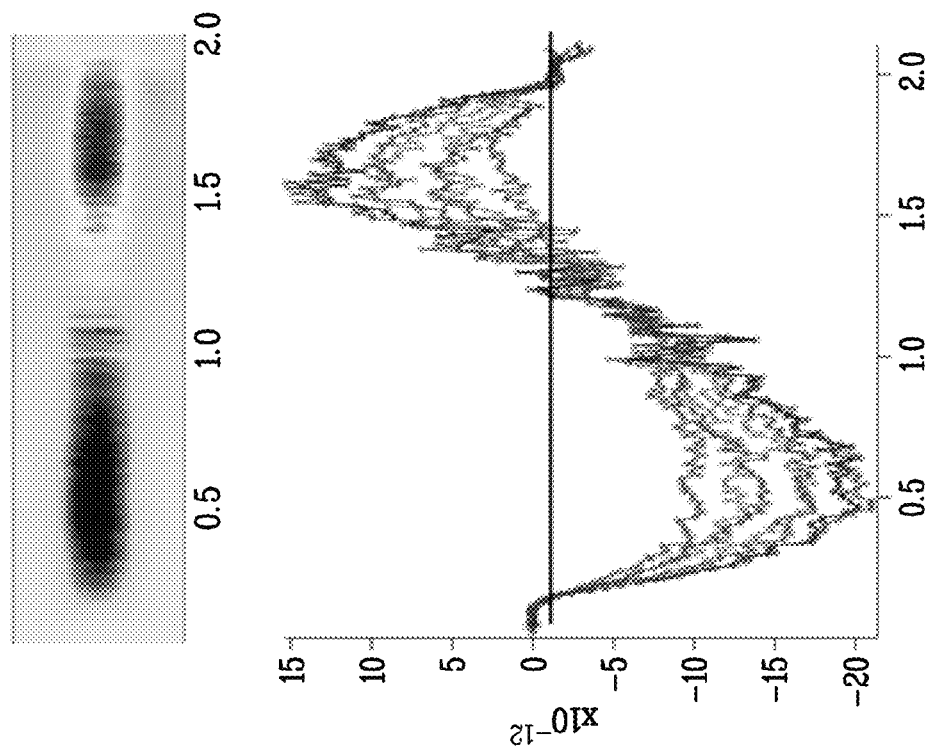
FIG. 20 presents exemplary core/shell resolution from EBIC for an exemplary device. The line profiles from red to blue is taken from the center axis to the side of the NW.
Figure 20B:
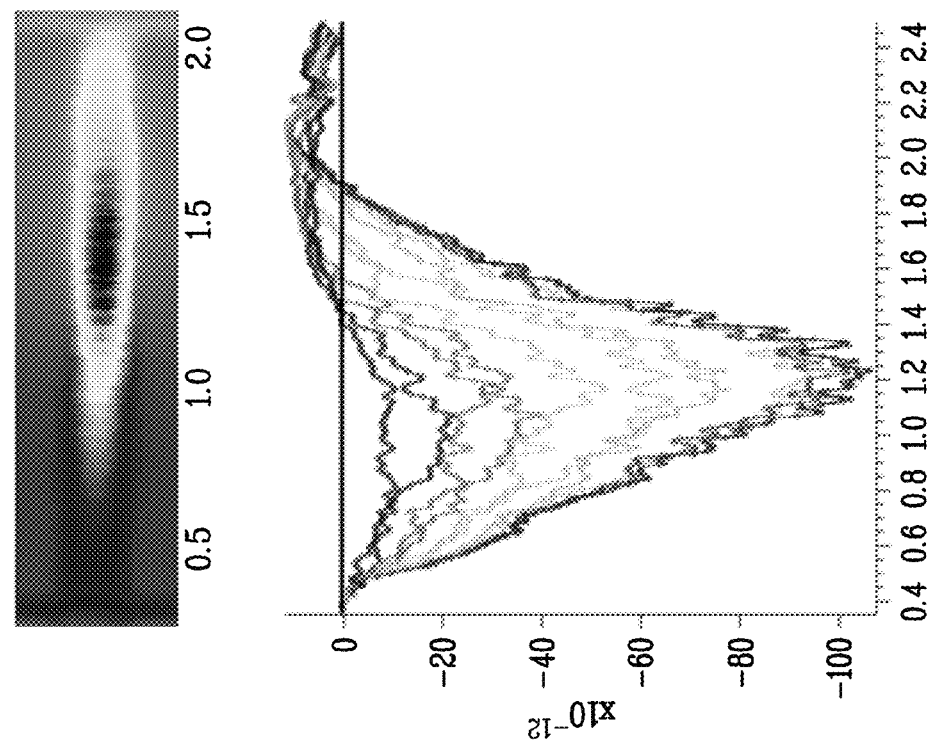

The radial EBIC profile resolves the carrier transport difference between the core and the shell at high kVs. In FIG. 20, a direct comparison of EBIC mapping between 10 kV and 3 kV on the same device is made. When the beam interacts only with the shell, the difference in the current profiles is limited to only amplitude since the decay length is expected to be uniform in homogeneous material. By comparing the line profiles at equal increment of radial distance from the center axis, the results were in good agreement.

Field-effect mobility is derived from transconductance while the effective mobility from drain conductance.

$$g_m = \frac{\partial I_{DS}}{\partial V_{GS}}\bigg|_{V_{DS}} = const.$$

$$I_D = \frac{W}{L} \mu_{eff} C_{ox} (V_{GS} - V_T) V_{DS}$$

$$\mu_{FE} = \frac{L g_m}{W C_{ox} V_{DS}}$$

While, $$g_d = \frac{\partial I_{DS}}{\partial V_{DS}}\bigg|_{V_{GS}} = const.$$

$$Q_n = C_{ox}(V_{GS} - V_T)$$

$$\mu_{eff} = \frac{g_d L}{W Q_n}$$

The difference between the two is caused by neglecting the gate voltage dependence of mobility. The equation connecting the two is the following.

$$\mu_{FE} = \frac{L g_m}{W C_{ox} V_{DS} \left(1 + \frac{(V_{GS} - V_T)}{\mu_{eff}} \frac{d\mu_{eff}}{dV_{GS}}\right)}$$

In nanowires, the equation form may be corrected based on the geometry of the NW and substrate.

Drift-Diffusion Coupling

When the conduction channel is subject to external electric field, the field will drag the excess carriers to form an asymmetry distribution. The drift can be analytically expressed as, $$\Delta n(x) = (\Delta n)_0 e^{-\frac{t}{\tau}},$$

with $$t = \frac{x}{\mu_n E}.$$

Comparing with the form $$\Delta n(x) = (\Delta n)_0 e^{-\frac{x}{L_{drft,n}}},$$

one can define the drifting length $L_{drft}$ as, $$L_{drft,n} = \mu_n E \tau.$$

Now one may couple the drift component into the continuity equation of diffusion, $$D_n \frac{\partial^2 \Delta n}{\partial x^2} - \mu_n E \frac{\partial \Delta n}{\partial x} - \frac{\Delta n}{\tau} = 0.$$

Using diffusion length $L_n$ and drift length $L_{dft,n}$, the equation can be written as, $$L_n^2 \frac{\partial^2 \Delta n}{\partial x^2} - L_{drft,n} \frac{\partial \Delta n}{\partial x} - \Delta n = 0.$$

The solution of the above equation will follow the form of $$\Delta n(x) = A e^{-\frac{x}{L_1}} + B e^{\frac{x}{L_2}}$$

$$L_1 = \frac{2 L_n^2}{\sqrt{L_{drft,n}^2 + 4 L_n^2} - L_{drft,n}}$$

$$L_2 = \frac{2 L_n^2}{\sqrt{L_{drft,n}^2 + 4 L_n^2} + L_{drft,n}};$$

From the above modified decay length involving the effect from the electric field, it can be easily seen that the length along the field will be extended while the one against the field is reduced.

Therefore, the field dependence of decay lengths from the EBIC measurements can be fitted to get $L_{drft}$.

Ambipolar Diffusion

A complete equation for diffusion includes the term in the spatial variation of the electric field. For electrons and holes diffusion toward one dimension, the equations write as $$\frac{\partial (\Delta n)}{\partial t} = -\frac{\Delta n}{\tau_n} + D_e \frac{\partial^2 (\Delta n)}{\partial x^2} + \mu_e F \frac{\partial (\Delta n)}{\partial x} + n \mu_e \frac{\partial F}{\partial x},$$

$$\frac{\partial (\Delta p)}{\partial t} = -\frac{\Delta p}{\tau_p} + D_h \frac{\partial^2 (\Delta p)}{\partial x^2} - \mu_h F \frac{\partial (\Delta p)}{\partial x} - p \mu_h \frac{\partial F}{\partial x}.$$

The first of these equations is multiplied by $\sigma_e = n e \mu_e$ and the second by $\sigma_h = n e \mu_h$ and then the two are added together. This yields a single equation, which is simplified by assuming that $\Delta p = \Delta n$ and $\tau_n = \tau_p$ only in the time derivative and recombination terms. The term involving the spatial variation of the electric field completely drops out of the resulting equation, and one is therefore free to make the latter assumption in the remaining terms, so that $$\frac{\partial (\Delta p)}{\partial t} = -\frac{\Delta p}{\tau_p} + \left(\frac{\sigma_e D_h + \sigma_h D_e}{\sigma_e + \sigma_h}\right) \frac{\partial^2 (\Delta p)}{\partial x^2} - \left(\frac{\sigma_e \mu_h + \sigma_h \mu_e}{\sigma_e + \sigma_h}\right) F \frac{\partial (\Delta p)}{\partial x}.$$

The ambipolar diffusion constant may now be defined as $$D_{ambi} = \frac{\sigma_e D_h + \sigma_h D_e}{\sigma_e + \sigma_h} = \frac{D_e D_h (n+p)}{n D_e + p D_h},$$

And the ambipolar mobility is similarly defined as $$\mu_{ambi} = \frac{\sigma_e \mu_h + \sigma_h \mu_e}{\sigma_e + \sigma_h} = \frac{\mu_e \mu_h (n-p)}{n \mu_e + p \mu_h}.$$

It is clear from the latter results that, for strongly extrinsic material, one may use the diffusion constant and mobility of the minority carriers in describing the diffusion behavior of the minority carriers. On the other hand, in intrinsic material, where n=p, the mobility and field effects drop out completely, and one needs only a simple diffusion model in which the effective diffusion constant is an average over those of each type of carrier.

What is claimed:

1. An electronic device, comprising:
   a semiconductor structure supported by a substrate,
      the semiconductor structure comprising a first material and a second material contacting one another, the first and second materials being arranged in a non-planar configuration,
      the second material comprising a binary or ternary inorganic or organic semiconductor material,
      the second material having a valence bandgap, conduction bandgap, or both that are broader than the corresponding band of the first material,
      wherein when the second material is a binary inorganic or organic semiconductor material, the first material is an elemental inorganic or organic semiconductor material, and when the second material is a ternary inorganic or organic semiconductor material, the first material is an elemental or binary in organic or organic semiconductor material, and the structure being in electronic communication with a source electrode and a drain electrode;

and, a source of illumination in optical communication with the structure, the source of illumination having a controllable intensity, wavelength, or both, wherein said device produces tunable negative differential resistance modulation, phase modulation, or both in response to varying the intensity or wavelength received from the source of illumination.

2. The electronic device of claim 1, wherein the first material of the semiconductor structure is in electronic communication with a source electrode and a drain electrode.

3. The electronic device of claim 1, wherein the first and second materials are arranged in a core-shell configuration, with the first material being characterized as the core.

4. The electronic device of claim 3, wherein the core-shell configuration defines a coaxial structure.

5. The electronic device of claim 4, wherein the coaxial structure is characterized as being cylindrical, faceted, braided, twisted, or any combination thereof.

6. The electronic device of claim 1, wherein the first material comprises a thickness in the range of from about 1 nm to about 500 nm.

7. The electronic device of claim 1, wherein the second material comprises a thickness in the range of from about 1 nm to about 500 nm.

8. The electronic device of claim 1, further comprising a gate electrode in electronic communication with the semiconductor structure.

9. The electronic device of claim 1, wherein the first material comprises a binary inorganic or organic semiconductor material.

10. The electronic device of claim 9, wherein the first material comprises GaAs.

11. The electronic device of claim 1, wherein the second material comprises AlGaAs.

12. The electronic device of claim 1, wherein the substrate comprises silicon, sapphire, or any combination thereof.

13. The electronic device of claim 1, wherein the device is in electronic communication with a complementary metal oxide semiconductor.

14. The electronic device of claim 9 wherein the second material comprises a ternary inorganic or organic semiconductor material.

* * * * *